United States Patent [19]

Tsuruda et al.

[11] Patent Number: 5,796,664
[45] Date of Patent: Aug. 18, 1998

[54] SEMICONDUCTOR MEMORY DEVICE HAVING DIVIDED WORD LINE

[75] Inventors: Takahiro Tsuruda; Kazutami Arimoto, both of Hyogo, Japan

[73] Assignee: Mitsubishi Denki Kabushiki Kaisha, Tokyo, Japan

[21] Appl. No.: 942,550

[22] Filed: Oct. 1, 1997

Related U.S. Application Data

[63] Continuation of Ser. No. 596,859, Feb. 5, 1996, abandoned.

[30] Foreign Application Priority Data

Feb. 21, 1995 [JP] Japan ................. 7-032373

[51] Int. Cl.$^6$ ................................ G11C 7/00
[52] U.S. Cl. .................. 365/200; 365/225.7; 365/203
[58] Field of Search .................... 365/200, 225.7, 365/203

[56] References Cited

U.S. PATENT DOCUMENTS

| | | | |
|---|---|---|---|
| 5,193,074 | 3/1993 | Anami | 365/230.06 |
| 5,487,041 | 1/1996 | Wada | 365/200 |
| 5,519,657 | 5/1996 | Arimoto | 365/200 |
| 5,574,729 | 11/1996 | Kinoshita et al. | 365/200 |

FOREIGN PATENT DOCUMENTS

| | | |
|---|---|---|
| 61-268000 | 11/1986 | Japan. |
| 3-162799 | 7/1991 | Japan. |
| 4-181589 | 6/1992 | Japan. |
| 4-182989 | 6/1992 | Japan. |
| 6-28890 | 2/1994 | Japan. |

OTHER PUBLICATIONS

Goro Kitsukawa et al. "256Mb DRAM Technologies for File Applications", 1993 IEEE International Solid-State circuits Conference, pp. 48–49.

Masahiko Yoshimoto et al. "A 64Kb Full CMOS RAM with Divided Word Line Structure", 1983 IEEE International Solid-State Circuits Conference, pp. 58–59.

Primary Examiner—Son T. Dinh
Attorney, Agent, or Firm—McDermott, Will & Emery

[57] ABSTRACT

In a DRAM having a plurality of memory array blocks, each of which has a plurality of sub-word lines connected to a main word line, a cell plate is provided correspondingly to each memory array block. A fuse is interposed between a cell plate potential supply line supplying a cell plate potential to the cell plate in each memory array block and the cell plate. By blowout of the fuse, supply of the cell plate potential to defective one among the memory array blocks is cut off. Thereby, a current consumption during standby is suppressed.

41 Claims, 15 Drawing Sheets

5,796,664

1

SEMICONDUCTOR MEMORY DEVICE HAVING DIVIDED WORD LINE

This application is a continuation of application Ser. No. 08/596,859 filed Feb. 5, 1996, abandoned.

BACKGROUND OF THE INVENTION

1. Field of the Invention

The present invention relates to a semiconductor memory device, and in particular to a dynamic random access memory (which will be referred to as a DRAM) having divided word lines.

2. Description of the Background Art

FIG. 12 is a circuit diagram showing a structure of a major portion of a conventional DRAM having divided word lines.

Referring to FIG. 12, the DRAM includes a memory cell array 1, a plurality of main word lines MWL, a spare main word line SMWL, a plurality of sub-word lines SWL1–SWL4, a plurality of main word drivers 3M, a plurality of sub-word drivers 31–34, a plurality of bit line pairs BL and $\overline{BL}$, a plurality of sense amplifiers 51 and an equalizer circuit EQ.

Memory cell array 1 includes a plurality of memory cells MC. In memory cell array 1, the plurality of main word lines MWL and spare main word line SMWL extend parallel to each other.

The plurality of main word lines MWL are driven by corresponding main word drivers 3M, respectively. Spare main word line SMWL is driven by a spare main word driver 3S. In memory cell array 1, a plurality of bit line pairs BL and $\overline{BL}$ extend perpendicularly to main word lines MWL and spare main word line SMWL.

Memory cell array 1 is divided into a plurality of memory array blocks MB each including a predetermined number of bit lines. One cell plate CP is provided correspondingly to each memory array block MB. Thus, memory cell array 1 is provided with a plurality of divided cell plates CP.

The plurality of sub-word lines SW1–SW4 are provided correspondingly to each of main word lines MWL and spare main word line SMWL. Sub-word lines SW1–SW4 in each set are connected to the corresponding one main word line MWL or spare main word line SMWL via sub-word drivers 31–34, respectively. Sub-word line SWL1–SWL4 are driven by corresponding sub-word drivers 31–34, respectively.

Each of sub-word drivers 31–34 corresponding to sub-word lines SWL1–SWL4 in each set is an AND gate receiving the following input signals.

Sub-word driver 31 receives a potential of corresponding main word line MWL or spare main word line SMWL, and a decode signal X4 based on the row address. Sub-word driver 32 receives a potential of corresponding main word line MWL or spare main word line SMWL, and a decode signal X3 based on the row address.

Sub-word driver 33 receives a potential of corresponding main word line MWL or spare main word line SMWL, and a decode signal X2 based on the row address. Sub-word driver 34 receives a potential of corresponding main word line MWL or spare main word line SMWL, and a decode signal X1 based on the row address. Decode signals X1–X4 are generated by a decode circuit which will be described later.

There are provided a plurality of sense amplifiers 51 corresponding to the plurality of bit line pairs BL and $\overline{BL}$, respectively. Each bit line pair BL and $\overline{BL}$ are connected to

2 corresponding sense amplifier 51 via transistors T4 and T5. Each sense amplifier 51 is provided for sensing and amplifying a potential difference at the corresponding bit line pair BL and $\overline{BL}$.

Equalizer circuit EQ is provided correspondingly to each bit line pair BL and $\overline{BL}$. Each equalizer circuit EQ is provided for equalizing the potentials on corresponding bit line pair BL and $\overline{BL}$, and includes three N-channel MOS transistors (which will be referred to as NMOS transistors) T1–T3. In each equalizer circuit EQ, transistor T1 is connected between the paired bit lines BL and $\overline{BL}$, and transistors T2 and T3 are connected in series between the paired bit lines BL and $\overline{BL}$.

Spare main word line SMWL is provided for repairing main word line MWL having a defect. Defective main word line MWL is replaced with spare main word line SMWL in the operation. This replacement is performed by such a manner that spare main word driver 3S activates spare main word line SMWL instead of activation of defective main word line MWL by main word driver 3M.

Thus, in this DRAM, the replacement is performed in main word drivers, i.e., in units each including main word driver. Since the main word driver forms the replaceable unit, main word line MWL is replaced even if a defect occurs only at sub-word line SWL.

In the DRAM thus constructed, potential supply lines and signal lines are arranged as follows for supplying various potentials and various signals to respective portions.

A cell plate potential supply line VCP extends along the plurality of memory array blocks MB of memory cell array 1. Potential supply line VCP supplies a cell plate potential to cell plate CP of each memory array block MB.

Along the plurality of memory array blocks MB, there are also arranged a bit line connect/disconnect signal line BLI for supplying a bit line connect/disconnect signal which acts to make connection/disconnection between corresponding bit line pair BL and $\overline{BL}$ and sense amplifier 51. Signal line BLI supplies the signal to gate electrodes of transistors T4 and T5 corresponding to bit line pair BL and $\overline{BL}$ for controlling these transistors.

Further, sense amplifier activation signal line S0 is arranged along the plurality of memory array blocks MB for supplying a sense amplifier activation signal which acts to activate sense amplifiers 51. Signal line S0 supplies the sense amplifier activation signal to respective sense amplifiers 51.

A bit line equalizing signal line BLEQ is arranged along the plurality of memory array blocks MB for supplying a bit line equalizing signal which acts to equalize bit line pair BL and $\overline{BL}$. Signal line BLEQ supplies the bit line equalizing signal to respective gate electrodes of transistors T1–T3 of each equalizer circuit EQ.

A bit line equalizing potential supply line VBL is also arranged along the plurality of memory blocks MB for supplying an equalizing potential for bit line pair BL and $\overline{BL}$. Potential supply line VBL supplies the bit line equalizing potential to respective source electrodes of transistors T2 and T3 of each equalizer circuit EQ.

In the conventional DRAM as described above, each of potential supply lines VCP and VBL as well as signal lines BLEQ, S0 and BLI is used by all memory array blocks MB. Thus, each of the potentials and signals is supplied from a single line. Also, the potential supply line VCP is directly connected to the plurality of cell plates CP.

Now, a structure of the decode circuit generating decode signals X1–X4 shown in FIG. 12 will be described below.

First, the structure of the decode circuit in the DRAM of the address multiplex type will be described below. According to the address multiplex type, row addresses and column addresses are successively supplied into the DRAM with a predetermined time interval.

FIG. 13 is a circuit diagram showing a structure of the decode circuit in the DRAM of the address multiplex type. Referring to FIG. 13, the decode circuit includes AND gates 301–304 and inverters 305 and 306.

An address signal R1 based on the row address is supplied to input terminals of AND gates 301 and 303 via inverter 305, and is directly supplied to AND gates 302 and 304. An address signal R2 based on the row address is supplied to AND gates 301 and 302 via inverter 306, and is directly supplied to input terminals of AND gates 303 and 304. AND gates 301–304 output decode signals X1–X4 in response to their inputs, respectively.

Then, a structure of a decode circuit in a DRAM of an address nonmultiplex type will be described below. According to the address nonmultiplex type, row and column addresses are input simultaneously.

FIG. 14 is a circuit diagram showing structure of the decode circuit in the DRAM of the address nonmultiplex type. Referring to FIG. 14, the decode circuit includes AND gates 3010, 3020, 3030 and 3040 as well as inverters 3050 and 3060. The decode circuit receives address signals R1 and R2 based on the received row address and also receives a block select signal BS based on the column address.

Address signal R1 is supplied to input terminals of AND gates 3010 and 3030 via inverter 3050, and is directly supplied to input terminals of AND gates 3020 and 3040. Address signal R2 is supplied to input terminals of AND gates 3010 and 3020 via inverter 3060, and is directly supplied to input terminals of AND gates 3030 and 3040.

Block select signal BS is directly supplied to input terminals of AND gates 3010, 3020, 3030 and 3040. AND gates 3010, 3020, 3030 and 3040 output decode signals X1–X4 in response to their inputs, respectively.

A structure of memory cell MC shown in FIG. 12 will be described below. FIG. 15 is a circuit diagram showing a structure of the memory cell in the DRAM. Referring to FIG. 15, memory cell MC includes a transfer gate transistor TR and a capacitor C.

Transfer gate transistor TR is connected between one of paired bit lines BL and $\overline{BL}$ and one of electrodes of capacitor C. Transfer gate transistor TR is connected at its gate electrode to sub-word line SWL. The other electrode of capacitor C is connected to cell plate CP. Memory cell MC thus constructed operates to perform writing or reading with respect to capacitor C when sub-word line SWL is activated.

A manner of performing replacement of the word line in the conventional DRAM thus constructed will be described below. FIG. 16 is a block diagram showing the structure of the conventional DRAM allowing replacement of the word line. In FIG. 16, the same portions as those in FIG. 12 bear the same reference numbers, and will not be described below.

Referring to FIG. 16, the DRAM includes memory cell array 1, a plurality of main word lines MWL1 and MWL2, a plurality of spare main word lines SMWL, a plurality of sub-word lines SWL11–SWL22, a plurality of spare sub-word lines SSWL1 and SSWL2, a plurality of bit line pairs BLP1 and BLP2, a plurality of main word drivers G11–G22, spare main word driver 3S, a plurality of sub-word drivers G11–G22, a plurality of spare sub-word drivers SG1 and SG2, a normal row decoder 30M, a spare row decoder 30S, a plurality of segment drivers 61 and 62, an address comparing circuit 600, a normal deactivation signal generating circuit 604 and a spare activation signal generating circuit 605.

Memory cell array 1 is divided into a plurality of memory array blocks MB1 and MB2. Main word lines MWL1 and MWL2 and spare main word line SMWL each extend through memory array blocks MB1 and MB2.

Memory array block MB1 includes sub-word lines SWL11–SWL21, spare sub-word line SSWL1, bit line pair BLP1, memory cells MC, a spare memory cell MC1, sub-word drivers G11 and G21 and spare sub-word driver SG1. Segment driver 61 is provided correspondingly to memory array block MB1.

Memory array block MB2 includes sub-word lines SWL12–SWL22, spare sub-word line SSWL2, bit line pair BLP2, memory cells MC, spare memory cell MC2, sub-word drivers G12 and G22 and spare sub-word driver SG2. Segment driver 62 is provided correspondingly to memory array block MB2.

Sub-word line SWL11 is connected to main word line MWL1 via sub-word driver G11, and sub-word line SWL12 is also connected to main word line MWL1 via sub-word driver G12. Sub-word line SWL21 is connected to main word line MWL2 via sub-word driver G21, and sub-word line SWL22 is also connected to main word line MWL2 via sub-word driver G22.

Spare sub-word line SSWL1 is connected to spare main word line SMWL via spare sub-word driver SG1, and spare sub-word line SSWL2 is also connected to spare main word line SMWL via spare sub-word driver SG2.

Each of segment drivers 61 and 62 outputs a signal for activating the sub-word lines and spare sub-word line in the corresponding memory array block, when the corresponding memory array block is selected based on the column address.

Each of sub-word drivers G11 and G21 and spare sub-word driver SG1 is formed of an AND gate, and receives the output signal of segment word driver 61. Each of sub-word drivers G11 and G21 and spare sub-word driver SG1 activates the corresponding sub-word line in response to the level of potential of the corresponding main word line (including spare main word line) and the level of output signal of segment word driver 61.

Memory cells MC are arranged at crossings between sub-word lines SWL11 and SWL21 and bit line pair BLP1 and crossings between sub-word lines SWL12 and SWL22 and bit line pair BLP2, respectively. Spare memory cells MC1 are arranged at a crossing between spare sub-word line SSWL1 and bit line pair BLP1 and a crossing between spare sub-word line SSWL2 and a bit line pair BLP2.

Each of memory cells MC and spare memory cell MC1 is connected to the sub-word line (including spare sub-word line) and the bit line pair at the corresponding crossing.

Normal row decoder 30M receives a row address RA, and outputs a signal for selectively operating one of the main word drivers. Spare row decoder 30S receives row address RA, and outputs a signal for operating spare word driver 3S.

The address of the defective row is programmed in address comparing circuit 600. Address comparing circuit 600 receives row address RA and compares the received row address with the programmed row address.

Address comparing circuit 600 sets its output signal to a first level when these row addresses match each other, and sets its output signal to a second level when they do not match. The output signal of address comparing circuit 600 is supplied to normal deactivation signal generating circuit 604 and spare activation signal generating circuit 605.

Normal deactivation signal generating circuit 604 sets its output signal to the L-level when the signal sent from address comparing circuit 600 is at the first level, and sets its output signal to the H-level when the signal sent from address comparing circuit 600 is at the second level. The output signal of normal deactivation signal generating circuit 604 is supplied to main word drivers 3M$a$ and 3M$b$.

Spare activation signal generating circuit 605 sets its output signal to the H-level when the signal sent from address comparing circuit 600 is at the first level, and sets its output signal to the L-level when the signal sent from address comparing circuit 600 is at the second level. The output signal of spare activation signal generating circuit 605 is supplied to spare main word driver 3S.

Each of main word drivers 3M$a$ and 3M$b$ receives the output signal of normal row decoder 30M and the output signal of normal deactivation signal generating circuit 604. Main word driver 3M$a$ activates main word line MWL1 when both the received signals are at the H-level. Main word driver 3M$b$ activates main word line MWL2 when both the received signals are at the H-level.

Spare main word driver 3S receives the output signal of spare row decoder 30S and the output signal of spare activation signal generating circuit 605. Spare main word driver 3S activates the spare main word line SMWL when both the received signals are at the H-level.

When the programmed row address and received row address RA do not match each other in address comparing circuit 600, the output signal of normal deactivation signal generating circuit 604 is at the H-level, and the output signal of spare activation signal generating circuit 605 is at the L-level. In response to this, the main word driver corresponding to row address RA activates the corresponding main word line.

When these row addresses do not match each other, the output signal of normal deactivation signal generating circuit 604 is at the L-level, and the output signal of spare activation signal generating circuit 605 is at the H-level. In response to this, the spare row decoder 30S activates the spare main word line SMWL.

In the DRAM thus constructed, replacement is performed in main word lines, i.e., units each including the main word line when a defect occurs. More specifically, main word driver related to the defective portion (main word line or sub-word line) is replaced with spare word driver 3S in the operation. Therefore, the replacement is performed to replace the unit including the main word line even when a defect occurs at one of sub-word lines SWL11–SWL22.

The conventional DRAM having the divided word lines described above suffers from the following problem.

In the conventional DRAM shown in FIG. 12, a leak-path is formed between potential supply line VBL and the GND potential of main word line MWL, when short circuit occurs between sub-word lines SWL1–SWL4 and bit line pair BL and $\overline{\text{BL}}$ in memory cell array 1.

When short circuit occurs between cell plate CP and bit line pair BL and $\overline{\text{BL}}$ in memory cell array 1, leak path is formed between potential supply line VCP and the GND potential of main word line MWL.

When such a situation occurs, a standby current generated during standby exceeds a predetermined value. This results in a defective chip of the DRAM.

In the manner of replacing the word line in the conventional DRAM shown in FIG. 16, the replacement is performed to replace the unit including the main word line even when only a sub-word line is defective. This results in a low efficiency of replacement.

SUMMARY OF THE INVENTION

Accordingly, it is an object of the invention to reduce a standby current in a DRAM having divided word lines. Another object of the invention is to improve an efficiency of replacement of a defective word line in a DRAM having divided word lines. Still another object of the invention is to increase an operation speed of a DRAM having divided word lines.

A semiconductor memory device according to the invention includes a memory cell array, a plurality of main word lines, a cell plate potential supply line and a plurality of cut-off circuits.

The memory cell array has a plurality of dynamic memory cells, and is divided into a plurality of memory array blocks. The plurality of main word lines extend through the plurality of memory array blocks.

Each of the plurality of memory cells includes a memory transistor and a memory capacitor. Each of the plurality of memory array blocks includes a plurality of sub-word lines and a cell plate. The plurality of sub-word lines are connected to the plurality of memory cells, and are also connected to the plurality of main word lines. The cell plate is divided correspondingly to the plurality of memory array blocks, and form a common electrode of the respective memory capacitors of the plurality of memory cells in each of the memory array blocks.

The cell plate potential supply line supplies a cell plate potential to the respective cell plates in the plurality of memory array blocks. The plurality of cut-off circuits are arranged between the cell plates in the plurality of memory array blocks and the cell plate potential supply line, respectively, and are provided for cutting off the supply of the cell plate potential to a defective one among the memory array blocks.

According to the above DRAM, the word lines are divided into the main word lines and the sub-word lines, and each of the plurality of memory array blocks has the sub-word lines. The cell plate is divided correspondingly to the plurality of memory array blocks.

The cell plate in each memory array block is supplied with a cell plate potential from the cell plate potential supply line via the cut-off circuit. The cut-off circuits are provided correspondingly to the plurality of memory array blocks, respectively. When a defect occurs at the memory array block, the cut-off circuit corresponding to the defective memory array block can cut off the supply of the cell plate potential.

Thereby, a current path is not formed between the main word line and the cell plate potential supply line, even when a defect occurs to make short circuit between the main word line and the cell plate. Therefore, a current consumption during standby can be reduced.

In the semiconductor memory device of the above aspect, all or a part of the plurality of cut-off circuits may be formed of fuse elements or transistor elements. In the structure where the plurality of cut-off circuits are formed of the transistor elements, the operation of the transistor elements may be controlled by a signal used for selecting the memory cell array. The operation of the transistor elements may be controlled by a signal used for selecting the corresponding memory array block.

The semiconductor memory device according to the above aspect is applicable to both DRAMs of the address multiplex type and address nonmultiplex type.

A semiconductor memory device according to another aspect of the invention includes a memory cell array, a plurality of main word lines, a plurality of bit line pairs, a plurality of equalizer circuits, an equalization control signal main supply line, a plurality of equalization control signal sub-supply lines, and a plurality of cut-off circuits.

The memory cell array has a plurality of dynamic memory cells, and is divided into a plurality of memory array blocks. The plurality of main word lines extend through the plurality of memory array blocks. The plurality of bit line pairs are arranged in the plurality of memory array blocks along a direction crossing the main word lines and are connected to the plurality of memory cells in the corresponding memory array blocks.

Each of the plurality of memory array blocks includes a plurality of sub-word lines connected to the plurality of memory cells in the memory array block, and is connected to the plurality of main word lines.

The plurality of equalizer circuits are provided correspondingly to the plurality of bit line pairs, and each are provided for equalizing potentials on the corresponding bit line pair.

The equalization control signal main supply line is arranged along the plurality of memory array blocks and is provided for supplying an equalization control signal for controlling the plurality of equalizer circuits.

The plurality of equalization control signal sub-supply lines are provided correspondingly to the plurality of memory array blocks, respectively, and each are provided for transmitting the equalization control signal supplied from the equalization control signal main supply line to each of the equalizer circuits equalizing the plurality of bit line pairs in the corresponding memory array block.

The plurality of cut-off circuits are provided correspondingly to the plurality of equalization control signal sub-supply lines, respectively, and are operable to cut off the supply of the equalization control signal from the equalization control signal main supply line to the equalization control signal sub-supply line corresponding to defective one among the memory array blocks.

According to the DRAM described above, the word lines are divided into the main word lines and the sub-word lines, and each of the memory array blocks has the sub-word lines. The signal lines for supplying the equalization signal, which is used for controlling the equalizer circuit provided correspondingly to each memory array block, are hierarchized into the equalization control signal main supply line and the plurality of equalization control signal sub-supply lines.

The equalization control signal main supply line is arranged along the plurality of memory array blocks for supplying the equalization control signal to all the memory array blocks. The plurality of equalization control signal sub-supply lines are provided individually and correspondingly to the plurality of memory array blocks, respectively, and are connected to the equalization control signal main supply line via the corresponding cut-off circuits, respectively.

According to the above structure, when a defect occurs at the memory array block, the cut-off circuit corresponding to the defective memory array block cuts off the supply of the equalization control signal to the equalizer circuit corresponding to the defective memory array block. Therefore, the current consumption during standby can be reduced.

In the semiconductor memory device according to this aspect, all of a part of the cut-off circuits may be formed of logic circuits. This structure may be operated in such a manner that the logic circuit receives a signal sent from the corresponding equalization signal supply line as well as a signal indicative of a result of determination whether the corresponding memory array block is defective or not, and the operation is controlled in response to these signals.

Moreover, in the semiconductor memory device according to this aspect, a plurality of switching circuits may be provided between the sense amplifier circuit provided correspondingly to the respective one of the plurality of bit line pairs and the memory cell array while providing the equalizer circuit between these plurality of switching circuits and the memory cell array.

The semiconductor memory device according to the above aspect is applicable to both DRAMs of the address multiplex type and address nonmultiplex type.

According to still another aspect, a semiconductor memory device includes a memory cell array, a plurality of main word lines, a plurality of bit line pairs, a plurality of sense amplifier circuits, a plurality of switching circuits, a switching control signal main supply line, a plurality of switching control signal sub-supply lines, and a plurality of cut-off circuits.

The memory cell array has a plurality of dynamic memory cells, and is divided into a plurality of memory array blocks. The plurality of main word lines extend through the plurality of memory array blocks. The plurality of bit line pairs are arranged in the plurality of memory array blocks along a direction crossing the main word lines and are connected to the plurality of memory cells in the corresponding memory array block.

Each of the plurality of memory array blocks includes a plurality of sub-word lines connected to the plurality of memory cells in the memory array block, and is connected to the plurality of main word lines.

The plurality of sense amplifier circuits are provided correspondingly to the plurality of bit line pairs, and each are operable to sense and amplify a potential difference on the corresponding bit line pair. The plurality of switching circuits are arranged between the corresponding bit line pairs and the sense amplifier circuits, respectively, and are operable to switch a state of connection between them. The switching control signal main supply line is arranged along the plurality of memory array blocks and is operable to supply a switching control signal for controlling the plurality of switching circuits.

The plurality of switching control signal sub-supply lines are provided correspondingly to the plurality of memory array blocks, respectively, and each are operable to transmit the switching control signal supplied from the switching control signal main supply line to the plurality of switching circuits corresponding to the plurality of bit line pairs in the corresponding memory array block.

The plurality of cut-off circuits are provided correspondingly to the plurality of switching control signal sub-supply lines, respectively, and each are operable to cut off the supply of the switching control signal sent from the switching control signal main supply line to the switching control signal sub-supply line corresponding to defective one among the memory array blocks.

In the DRAM of this aspect, the word lines are divided into the main word lines and the sub-word lines, and each of the memory array blocks has the sub-word lines. The signal lines for supplying the switching control signal, which is used for controlling the switching circuit between the bit line pair in each memory array block and the corresponding sense amplifier circuit, are hierarchized into the switching control signal main supply line and the plurality of switching control signal sub-supply lines.

The switching control signal main supply line is arranged along the plurality of memory array blocks for supplying the switching control signal to all the memory array blocks. The plurality of switching control signal sub-supply lines are provided individually and correspondingly to the plurality of memory array blocks, respectively, and are connected to the switching control signal main supply line via the corresponding cut-off circuits, respectively.

According to the above structure, when a defect occurs at the memory array block, the cut-off circuit corresponding to the defective memory array block cuts off the supply of the switching control signal to the switching circuit corresponding to the defective memory array block. Therefore, the current consumption during standby can be reduced.

The semiconductor memory device according to the above aspect is applicable to both DRAMs of the address multiplex type and address nonmultiplex type.

A semiconductor memory device according to further another aspect of the invention includes a memory cell array, a plurality of main word lines, a plurality of bit line pairs, a plurality of equalizer circuits, an equalization potential main supply line, a plurality of equalization potential sub-supply lines, and a plurality of cut-off circuits.

The memory cell array has a plurality of dynamic memory cells, and is divided into a plurality of memory array blocks. The plurality of main word lines extend through the plurality of memory array blocks. The plurality of bit line pairs are arranged in each of the plurality of memory array blocks along a direction crossing the main word lines and are connected to the plurality of memory cells in the corresponding memory array block.

Each of the plurality of memory array blocks includes a plurality of sub-word lines connected to the plurality of memory cells in the memory array block, and is connected to the plurality of main word lines.

The plurality of equalizer circuits are provided correspondingly to the plurality of bit line pairs, and each are provided for equalizing potentials on the corresponding bit line pair. The equalization potential main supply line is arranged along the plurality of memory array blocks and is provided for supplying an equalization potential for equalizing the plurality of bit line pairs.

The plurality of equalization potential sub-supply lines are provided correspondingly to the plurality of memory array blocks, respectively, and each are provided for transmitting the equalization potential supplied from the equalization potential main supply line to each of the equalizer circuits equalizing the plurality of bit line pairs in the corresponding memory array block.

The plurality of cut-off circuits are provided correspondingly to the plurality of equalization potential sub-supply lines, respectively, and are operable to cut off the supply of the equalization potential sent from the equalization potential main supply line to the equalization potential sub-supply line corresponding to defective one among the memory array blocks.

According to the DRAM described above, the word lines are divided into the main word lines and the sub-word lines, and each of the memory array blocks has the sub-word lines. The signal lines for supplying the equalization potential, which is used for the bit line pairs, to the equalizer circuits provided correspondingly to the respective memory array blocks, are hierarchized into the equalization potential main supply line and the plurality of equalization potential sub-supply lines.

The equalization potential main supply line is arranged along the plurality of memory array blocks for supplying the equalization potential to all the memory array blocks. The plurality of equalization potential sub-supply lines are provided individually and correspondingly to the plurality of memory array blocks, respectively, and are connected to the equalization potential main supply line via the corresponding cut-off circuits, respectively.

According to the above structure, when a defect occurs at the memory array block, the cut-off circuit corresponding to the defective memory array block cuts off the supply of the equalization potential to the equalizer circuit corresponding to the defective memory array block.

Thereby, a current path is not formed between the main word line and the equalization potential main supply line, even when a defect occurs to make short circuit between the main word line and the bit line pair. Therefore, a current consumption during standby can be reduced.

Moreover, in the semiconductor memory device according to this aspect, a plurality of switching circuits may be provided between the sense amplifier circuit provided corresponding to the respective one of the plurality of bit line pairs and the memory cell array while providing the equalizer circuit between these plurality of switching circuits and the memory cell array.

The semiconductor memory device according to the above aspect is applicable to both DRAMs of the address multiplex type and address nonmultiplex type.

A semiconductor memory device according to a further aspect of the invention includes a memory cell array, a plurality of main word lines, a plurality of bit line pairs, a plurality of sense amplifier circuits, a sense amplifier activation signal main supply line, a plurality of sense amplifier activation signal sub-supply lines, and a plurality of cut-off circuits.

The memory cell array has a plurality of dynamic memory cells, and is divided into a plurality of memory array blocks. The plurality of main word lines extend through the plurality of memory array blocks. The plurality of bit line pairs are arranged in the plurality of memory array blocks along a direction crossing the main word lines and are connected to the plurality of memory cells in the corresponding memory array block.

Each of the plurality of memory array blocks is connected to the plurality of memory cells in the memory array block, and has a plurality of sub-word lines respectively connected to the plurality of main word lines.

The plurality of sense amplifier circuits are provided correspondingly to the plurality of bit line pairs, and each are operable to sense and amplify a potential difference on the corresponding bit line pair.

The sense amplifier activation signal main supply line is arranged along the plurality of memory array blocks and is operable to supply a sense amplifier activation signal for activating the plurality of sense amplifier circuits.

The plurality of sense amplifier activation signal sub-supply lines are provided correspondingly to the plurality of memory array blocks, respectively, and each are operable to transmit the sense amplifier activation signal supplied from the sense amplifier activation signal main supply line to the plurality of sense amplifier circuits corresponding to the plurality of bit line pairs in the corresponding memory array block.

The plurality of cut-off circuits are provided correspondingly to the plurality of sense amplifier activation signal sub-supply lines, respectively, and each are operable to cut off the supply of the sense amplifier activation signal sent from the sense amplifier activation signal main supply line to the sense amplifier activation signal sub-supply line corresponding to the defective memory array block.

In the DRAM of this aspect, the word lines are divided into the main word lines and the sub-word lines, and each of the memory array blocks has the sub-word lines. The signal lines for supplying the sense amplifier activation signal, which is used for activating the sense amplifier circuit provided correspondingly to the bit line pair in each memory array block, are hierarchized into the sense amplifier activation signal main supply line and the plurality of sense amplifier activation signal sub-supply lines.

The sense amplifier activation signal main supply line is arranged along the plurality of memory array blocks for supplying the sense amplifier activation signal to all the memory array blocks. The plurality of sense amplifier activation signal sub-supply lines are provided individually and correspondingly to the plurality of memory array blocks, respectively, and are connected to the sense amplifier activation signal main supply line via the corresponding cut-off circuits, respectively.

According to the above structure, when a defect occurs at the memory array block, the cut-off circuit corresponding to the defective memory array block cuts off the supply of the sense amplifier activation signal to the sense amplifier circuit corresponding to the defective memory array block. Therefore, the current consumption during standby can be reduced.

The semiconductor memory device according to the above aspect is applicable to both DRAMs of the address multiplex type and address nonmultiplex type.

A semiconductor memory device according to a further aspect of the invention includes a memory cell array, a plurality of normal main word lines, a redundant main word line, a plurality of normal sub-word line activating circuits, and a plurality of redundant sub-word line activating circuits.

The memory cell array has a plurality of memory cells, and is divided into a plurality of memory array blocks. The plurality of normal main word lines extend through the plurality of memory array blocks. The redundant main word line extends through the plurality of memory array blocks.

Each of the memory array blocks includes a plurality of normal sub-word lines, a plurality of memory cells, a redundant sub-word line and a redundant memory cell.

The plurality of normal sub-word lines are connected to the plurality of main word lines, respectively. The plurality of normal memory cells are connected to the plurality of normal sub-word lines, respectively. The redundant sub-word line is connected to the redundant main word line, and the defective normal sub-word line is replaceable with the redundant sub-word line. The redundant memory cell is connected to the redundant sub-word line.

The plurality of normal sub-word line activating circuits are provided correspondingly to the plurality of memory array blocks, respectively, and each are operable to activate the plurality of normal sub-word lines in the corresponding memory array block.

The plurality of redundant sub-word line activating circuits are provided correspondingly to the plurality of memory array blocks, respectively, and each are operable to activate the redundant sub-word line instead of the defective normal sub-word line in the corresponding memory array block.

According to the DRAM of the above aspect, the plurality of normal sub-word line activating circuits and the plurality of redundant sub-word line activating circuits are provided correspondingly to the plurality of memory array blocks, respectively.

In each memory array block, the corresponding normal sub-word line activating circuit activates the normal sub-word line connected to the normal main word line, and the corresponding redundant sub-word line activating circuit activates the redundant sub-word line connected to the redundant main word line.

The redundant sub-word line activating circuit operates when a defect occurs at the normal sub-word line in the corresponding memory array block, and more specifically activates the redundant sub-word line in the corresponding memory array block instead of the defective normal sub-word line. Thus, replacement of the defective normal sub-word line is performed in sub-word lines, i.e., in units each related only to the sub-word line. Therefore, an efficiency of replacement of the defective word line can be increased or improved.

The semiconductor memory device of the above aspect may have the following structure. The semiconductor memory device further includes a redundant main word line activating circuit for always activating the redundant main word line. Further, each of the redundant sub-word line activating circuits receives an address for selecting the normal sub-word line, and activates the corresponding redundant sub-word line in response to the received address.

According to this structure, the redundant main word line activating circuit always activates the redundant main word line in each of the memory array blocks. When a defect occurs at the normal sub-word line in each memory array block, the redundant sub-word line in each memory array block is selected by the redundant sub-word line activating circuit responsive to the address used for selecting the normal sub-word line.

Therefore, in the case where the normal sub-word line is replaced with the redundant sub-word line, the access can be performed without requiring address comparing operation for selecting the redundant main word line, and the replaced redundant sub-word line can be selected only by selecting the redundant sub-word line responsive to the address related to selection of the normal sub-word line. Accordingly, the access speed can be increased.

The semiconductor memory device of this aspect may have the following structure. A column address is input after input of a row address containing an address for selecting the normal sub-word line to be activated, and the plurality of normal sub-word line activating circuits and the plurality of redundant sub-word line activating circuits select the plurality of corresponding normal sub-word lines and the corresponding redundant sub-word lines related to the row address, respectively.

According to this structure, the DRAM of an address multiplex type, in which the column address is input after input of the row address containing the address for selecting the normal sub-word line to be activated, operates in such a manner that the plurality of normal sub-word lines and the corresponding redundant sub-word line are selected in connection with the preceding row address. Therefore, the DRAM of the address multiplex type can perform the replacement in sub-word lines in each memory array block.

The semiconductor memory device of this aspect may have the following structure. A row address and a column address are input simultaneously, and the plurality of normal sub-word line activating circuits and the plurality of redundant sub-word line activating circuits select the plurality of corresponding normal sub-word lines and the redundant sub-word lines related to the row or column address, respectively.

According to this structure, the DRAM of an address nonmultiplex type, in which the row and column addresses are input simultaneously, operates in such a manner that the plurality of normal sub-word lines and the corresponding redundant sub-word line are selected in connection with the row or column address. Therefore, the DRAM of the address nonmultiplex type can perform the replacement in sub-word lines in each memory array block.

The semiconductor memory device according to this aspect may have the following structure. The memory cell array further includes a redundant memory array block, and the redundant memory array block includes a plurality of spare sub-word lines connected respectively to the plurality of normal main word lines and a plurality of spare memory cells connected respectively to the plurality of spare sub-word lines.

Further, the semiconductor memory device includes a spare sub-word line selecting circuit. The spare sub-word line selecting circuit is operable to activate the plurality of spare sub-word lines connected to the normal main word line, which is connected to the defective normal sub-word line, instead of the sub-word lines including the defective sub-word line in the memory array block.

The normal sub-word line in each of the memory array blocks can be replaced with the redundant sub-word line in the corresponding memory array block or the spare sub-word line connected to the corresponding normal main word line.

According to this structure, the defective normal sub-word line is replaced with the redundant sub-word line in the corresponding memory array block or the normal main word line connected to the normal sub-word line. This increases the degree of freedom in replacement of the normal sub-word line.

In addition, in the semiconductor memory device according to this aspect, a structure for cutting off supply of cell plate potential, equalization control signal, switching control signal, equalization potential or sense amplifier activation signal as employed in the semiconductor memory device according to the above-described other aspects may be adopted.

A semiconductor memory device according to a further aspect of the invention includes a memory cell array, a normal main word line, a plurality of sense amplifier circuits, a plurality of switching circuits and an address comparison control circuit.

The memory cell array has a plurality of memory cells, and is divided into a plurality of normal memory array blocks and a redundant memory array block. The normal main word lines extend through the plurality of normal memory array blocks and the redundant memory array block.

Each of the normal memory array blocks includes a plurality of normal sub-word lines, a plurality of normal memory cells and a normal bit line pair. The plurality of normal sub-word lines are connected to the plurality of normal main word lines, respectively. The plurality of normal memory cells are connected to the normal sub-word lines, respectively. The normal bit line pair crosses the plurality of normal main word lines, and receives data selectively from the plurality of normal memory cells.

The redundant memory array block includes a plurality of redundant sub-word lines, a plurality of redundant memory cells and a redundant bit line pair.

The plurality of redundant sub-word lines are connected to the plurality of normal main word lines, respectively. The plurality of redundant memory cells are connected to the plurality of redundant sub-word lines. The redundant bit line pair crosses the plurality of normal main word lines, and receives data selectively from the plurality of redundant memory cells.

Each of the redundant sub-word lines can be replaced with the defective normal sub-word line connected to the corresponding normal main word line.

The plurality of sense amplifier circuits are provided correspondingly to the normal bit line pairs in the memory array blocks and the redundant bit line pair, respectively, and each sense and amplify the potential difference on the corresponding bit line pair.

An input/output line pair transmits the outputs sent from the respective sense amplifier circuits. The plurality of switching circuits are arranged between the plurality of sense amplifier circuits and the input/output line pair, respectively, and are selectively turned on/off for selectively transmitting the outputs of the plurality of sense amplifier circuits to the input/output line pair.

The address comparison control circuit is operable to store precedingly an address corresponding to the normal sub-word line replaced with the redundant sub-word line, and compare the address with an address input for selecting the normal sub-word line. When these addresses match each other, the address comparison control circuit controls the plurality of switching circuits to transmit the output of the sense amplifier circuit corresponding to the redundant bit line pair to the input/output line pair. When these addresses do not match each other, it controls the plurality of switching circuits to transmit the output of the sense amplifier circuit corresponding to the normal bit line pair to the input/output line pair.

The amplifying operation by the plurality of sense amplifier circuits are executed in parallel with the address comparing operation by the address comparison control circuit.

In the operation, the plurality of sense amplifier circuits amplify the potential differences on the plurality of normal bit line pairs and the redundant bit line pair. In parallel with this operation of amplifying the potential difference on each bit line pair, the address comparison control circuit executes the address comparing operation.

The address comparison control circuit controls the plurality of switching circuits to transmit selectively the output of the sense amplifier circuit corresponding to the redundant bit line pair to the input/output line pair, when the address precedingly stored and corresponding to the replaced normal sub-word line matches the address which is input for selecting the normal sub-word line.

Meanwhile, when these addresses do not match each other, the address comparison control circuit controls the plurality of switching circuits to transmit selectively the output of the sense amplifier circuit corresponding to the normal bit line pair to the input/output line pair.

As described above, the amplifying operation by the sense amplifier circuit and the address comparing operation by the address comparison control circuit are performed in parallel with each other, so that the operation speed can be increased. Since replacement of the defective normal sub-word line with the redundant sub-word line is performed in sub-word lines, the efficiency of replacement of the word line can be increased.

A semiconductor memory device according to a further aspect of the invention includes a memory cell array, a plurality of normal main word lines, a plurality of sense amplifier circuits, a plurality of input/output line pairs, an address comparing circuit, and a multiplexer circuit.

The memory cell array has a plurality of memory cells, and is divided into a plurality of normal memory array blocks and a redundant memory array block. The normal main word lines extend through the plurality of normal memory array blocks and the redundant memory array block.

Each of the normal memory array blocks includes a plurality of normal sub-word lines, a plurality of normal memory cells and a normal bit line pair. The plurality of normal sub-word lines are connected to the plurality of normal main word lines, respectively. The plurality of normal memory cells are connected to the normal sub-word lines, respectively. The normal bit line pair crosses the plurality of normal main word lines, and receives data selectively from the plurality of normal memory cells.

The redundant memory array block includes a plurality of redundant sub-word lines, a plurality of redundant memory cells and a redundant bit line pair.

The plurality of redundant sub-word lines are connected to the plurality of normal main word lines, respectively. The plurality of redundant memory cells are connected to the plurality of redundant sub-word lines, respectively. The redundant bit line pair crosses the plurality of normal main word lines, and receives data selectively from the plurality of redundant memory cells.

Each of the redundant sub-word lines can be replaced with the defective normal sub-word line connected to the corresponding main word line.

The plurality of sense amplifier circuits are provided correspondingly to the normal bit line pairs in the plurality of memory array blocks and the redundant bit line pair, respectively, and each sense and amplify the potential difference on the corresponding bit line pair.

The plurality of input/output line pairs are provided correspondingly to the plurality of sense amplifier circuits, and each transmit the output of the corresponding sense amplifier circuit.

The address comparing circuit is operable to store precedingly an address corresponding to the normal sub-word line replaced with the redundant sub-word line, and compare the address with an address input for selecting the normal sub-word line for outputting a result of the comparison.

The multiplexer circuit receives information indicative of the result of comparison by the address comparing circuit. When the compared addresses match each other, the multiplexer circuit outputs the potential difference on the input/output line pair transmitting the output of the sense amplifier circuit corresponding to the redundant bit line pair. When these addresses do not match each other, it outputs the potential difference on the input/output line pair transmitting the output of the sense amplifier circuit corresponding to the normal bit line pair.

The amplifying operation by the plurality of sense amplifier circuits are executed in parallel with the address comparing operation by the address comparing circuit.

In the operation, the plurality of sense amplifier circuits amplify the potential differences on the plurality of normal bit line pairs and the redundant bit line pair. The outputs of these sense amplifier circuits are individually transmitted onto the corresponding input/output line pairs, respectively.

In parallel with the amplifying operation by the respective sense amplifier circuits, the address comparison control circuit executes the address comparing operation.

The address comparison control circuit compares the address precedingly stored and corresponding to the replaced normal sub-word line with the address which is input for selecting the normal sub-word line. When the addresses compared by the address comparing circuit match each other, the multiplexer circuit outputs the potential difference on the input/output line pair transmitting the output of the sense amplifier circuit corresponding to the redundant bit line pair.

When these addresses do not match each other, the multiplexer circuit outputs the potential difference on the input/output line pair transmitting the output of the sense amplifier circuit corresponding to the normal bit line pair.

The above operation can achieve the following advantage. Since replacement of the defective normal sub-word line with the redundant sub-word line is performed in sub-word lines, the efficiency of replacement of the word line can be increased. Further, the amplifying operation by the sense amplifier circuit and the address comparing operation by the address comparison control circuit are performed in parallel with each other. In other words, the data transmitting operation by the input/output line pair and the address comparing operation are performed in parallel with each other. Therefore, the operation speed can be increased.

A semiconductor memory device according to a further aspect of the invention includes a memory cell array and a plurality of main word lines.

The memory cell array has a plurality of dynamic memory cells. The plurality of main word lines extend through the memory cell array.

The memory cell array is divided into a plurality of normal memory array blocks and a redundant memory array block replaceable with defective one among the normal memory array blocks.

Each of the normal and redundant memory array blocks has a plurality of sub-word lines connected to the plurality of memory cells in the memory array block and connected to the plurality of main word lines, respectively.

In a refresh operation, the sub-word lines connected to the main word lines to be activated are activated in all of the plurality of normal memory array blocks and the redundant memory array block.

As described above, the DRAM in which the word lines are divided into the main word lines and the sub-word lines includes the memory cell array which is divided into the plurality of normal memory array blocks and the redundant memory array block. The normal memory array block in which a defect occurs is replaced with the redundant memory array block.

In the DRAM having the divided word lines, therefore, replacement of the sub-word line can be performed in memory array blocks, i.e., in units each including the memory array block, when a defect occurs at the sub-word line.

In the refresh operation of a general DRAM, only the row address is input, and the word line is activated based on the row address. Data of the memory cells connected to the activated main word line is refreshed.

In the above refresh operation, the sub-word lines connected to the main word lines to be activated are activated in all the normal memory array blocks and the redundant memory array block. Therefore, refresh can be performed appropriately in the DRAM which has the sub-word lines for each memory array block as well as the redundant memory array block.

According to a further aspect of the invention, a semiconductor memory device wherein row and column addresses are successively input, and a memory cell is selected in accordance with the input row and column addresses, includes a memory cell array and a plurality of main word lines.

The memory cell array has a plurality of dynamic memory cells. The plurality of main word lines extend through the memory cell array, and are selected in accordance with the row address.

Further, the memory cell array is divided into a plurality of normal memory array blocks and a redundant memory array block replaceable with defective one among the normal memory array blocks.

Each of the normal and redundant memory array blocks has a plurality of sub-word lines connected to the plurality of memory cells in the memory array block and connected to the plurality of main word lines, respectively.

In a normal operation and a refresh operation, the sub-word lines connected to the main word lines to be activated are activated in all of the plurality of normal memory array blocks and the redundant memory array block.

As described above, in the DRAM of the address multiplex type, in which the word lines are divided into the main word lines and the sub-word lines, and the memory cell is selected in accordance with the successively input row and column addresses, the memory cell array is divided into the plurality of normal memory array blocks and the redundant memory array block. The normal memory array block in which a defect occurs is replaced with the redundant memory array block.

In the DRAM having the divided word lines, therefore, replacement of the sub-word line can be performed in memory array blocks, i.e., in units each including the memory array block, when a defect occurs at the sub-word line.

In the refresh operation of a general DRAM, only the row address is input, and the word line is activated based on the input row address. Data of the memory cells connected to the activated main word line is refreshed.

In the above refresh operation, the sub-word lines connected to the main word lines to be activated are activated in all the normal memory array blocks and the redundant memory array block. Therefore, refresh can be performed appropriately in the DRAM of the address multiplex type which has the sub-word lines for each memory array block as well as the redundant memory array block.

In the DRAM of the address multiplex type, the column address is not yet input at the time that the row address is input and the main word line is activated. Even in the normal operation of the DRAM of the address multiplex type, the sub-word lines connected to the main word lines to be activated are activated in all the normal and redundant memory array blocks.

Therefore, the normal operation can be performed appropriately in accordance with the address input type in the DRAM of the address multiplex type which has the sub-word lines for each memory array block as well as the redundant memory array block.

According to a further aspect of the invention, a semiconductor memory device wherein a memory cell is selected in accordance with simultaneously input row and column addresses includes a memory cell array and a plurality of main word lines.

The memory cell array has a plurality of dynamic memory cells. The plurality of main word lines extend through the memory cell array, and are selected in accordance with the row address.

Further, the memory cell array is divided into a plurality of normal memory array blocks and a redundant memory array block replaceable with defective one among the normal memory array blocks.

Each of the plurality of normal memory array blocks and the redundant memory array block has a plurality of sub-word lines connected to the plurality of memory cells in the memory array block and connected to the plurality of main word lines, respectively.

In a refresh operation, the sub-word lines connected to the main word lines to be activated are activated in all of the plurality of normal memory array blocks and the redundant memory array block.

As described above, in the DRAM of the address nonmultiplex type, in which the word lines are divided into the main word lines and the sub-word lines, and the memory cell is selected in accordance with the simultaneously input row and column addresses, the memory cell array is divided into the plurality of normal memory array blocks and the redundant memory array block. The normal memory array block in which a defect occurs is replaced with the redundant memory array block.

In the DRAM having the divided word lines, therefore, replacement of the sub-word line can be performed in memory array blocks, i.e., in units each including the memory array block, when a defect occurs at the sub-word line.

In the refresh operation of a general DRAM, only the row address is input, and the word line is activated based on the input row address. Data of the memory cells connected to the activated main word line is refreshed.

In the above refresh operation, the sub-word lines connected to the main word lines to be activated are activated in all the normal memory array blocks and the redundant memory array block. Therefore, refresh can be performed appropriately in the DRAM of the address nonmultiplex type which has the sub-word lines for each memory array block as well as the redundant memory array block.

In the DRAM of the address nonmultiplex type, the column address is input at the time that the row address is input. In the normal operation of the DRAM of the address nonmultiplex type, the sub-word lines connected to the main word lines to be activated are activated in selected memory array block.

Therefore, the normal operation can be performed appropriately in accordance with the address input type in the DRAM of the address nonmultiplex type which has the sub-word lines for each memory array block as well as the redundant memory array block.

A semiconductor memory device according to yet another aspect of the present invention includes a memory cell array, a plurality of main word lines, a main supply line, a plurality of sub-supply line and a plurality of cut-off circuits.

The memory cell array has a plurality of dynamic type memory cells, and is divided into a plurality of memory array blocks. The plurality of main word lines are extended through the plurality of memory array blocks.

Each of the plurality of memory array blocks includes a plurality of sub-word lines connected to the plurality of memory cells in that memory array block as well as to the plurality of main word lines, respectively.

The main supply line is provided along the plurality of memory array blocks and supplys the potential used for the operation of the plurality of memory array blocks. The plurality of sub-suplly lines are provided correspondingly to the plurality of memory array blocks, respectively, each provided for further transmission of potential supplied from the main supply line for the operation of the corresponding memory array block.

The plurality of cut-off circuits are provided correspondingly to the plurality of sub-supply lines, respectively, so as to cut off the supply of potential from the main supply line to the sub-supply line corresponding to a defective memory array block.

Thus, in a DRAM, a word line is divided into a main word line and a sub-word line. A plurality of memory array blocks each have a sub-word line. A supply line for supplying potential used for the operation of the memory array block is hiararchized into a main supply line and a sub-supply line.

The main supply line is provided along the plurality of memory array blocks in order to supply the potential used for the operation of every memory array block. The plurality of sub-supply lines are provided separately corresponding to respective ones of the plurality of memory array blocks and are connected to the main supply line via a corresponding cut-off circuit, respectively.

Accordingly, when defect occurs at a memory array block, the cut-off circuit corresponding to that memory array block can cut off the supply of potential used for the operation of that defective memory array block. Therefore, the current consumption during standby can be reduced.

Here, the potential used for the operation of the memory array block includes not only the potential for defining the potential within the memory array block but also the potential of the signals.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

First Embodiment

Description will now be given on whole structures of DRAMs of the address multiplex type and address nonmultiplex type to which the present invention is applied.

Figure 1:
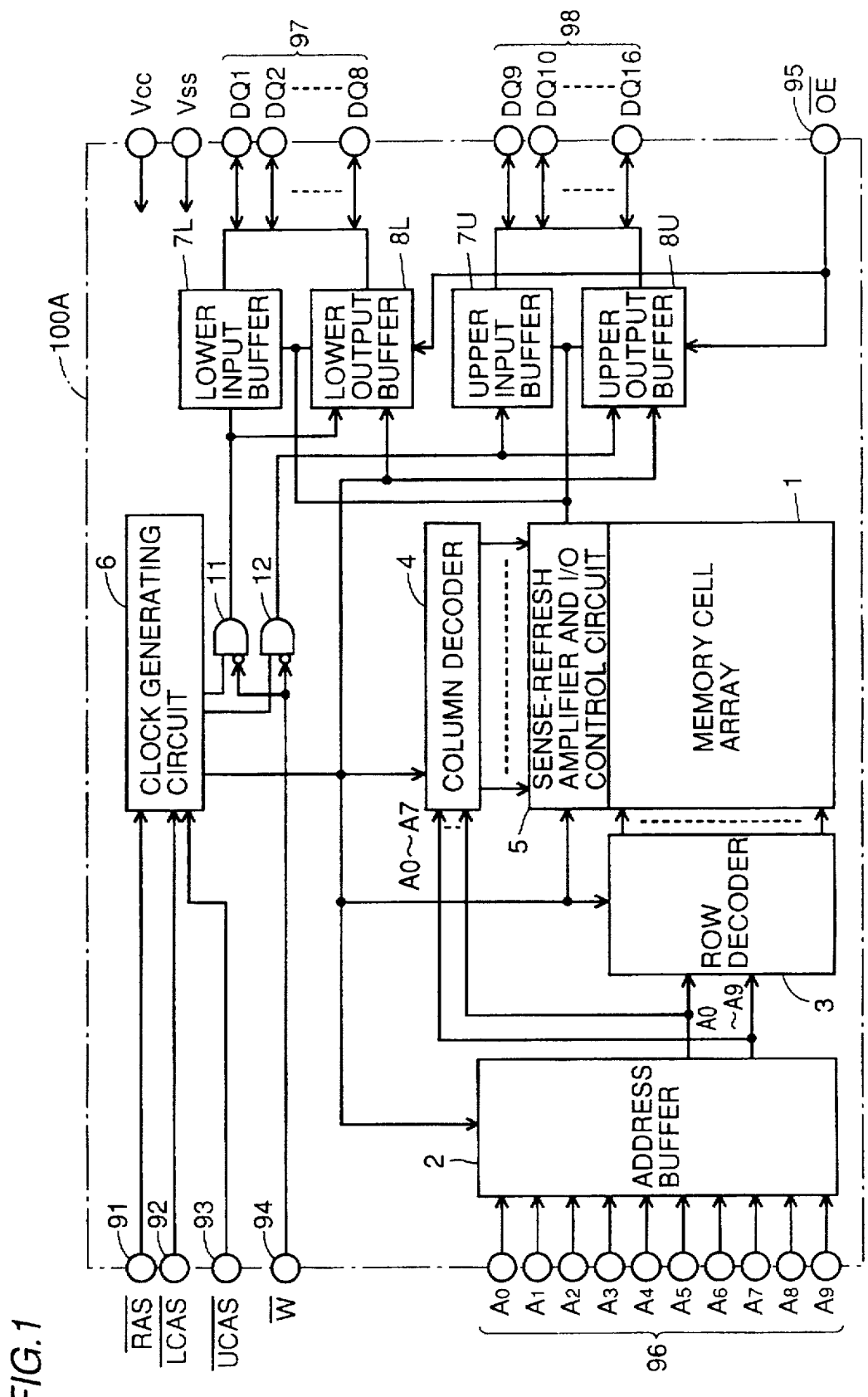
FIG. 1 is a block diagram showing a whole structure of a DRAM of an address multiplex type.

First, the DRAM of the address multiplex type will be described below. FIG. 1 is a block diagram showing a whole structure of the DRAM of the address multiplex type.

Referring to FIG. 1, DRAM 100A of the address multiplex type includes a memory cell array 1, an address buffer 2, a row decoder 3, a column decoder 4, a sense refresh amplifier and I/O control circuit 5, a clock generating circuit 6, a lower input buffer 7L, an upper input buffer 7U, a lower output buffer 8L, an upper output buffer 8U, AND gates 11 and 12, signal input terminals 91–95, an address input terminal 96, a lower data I/O terminal 97 and an upper data I/O terminal 98.

Memory cell array 1 has a plurality of memory cells and accumulates storage information. Address buffer 2 externally receives address signals A0–A9 via address input terminal 96. Address buffer 2 applies received address signals A0–A9 to row decoder 3 as internal address signals, and applies received address signals A0–A7 to column decoder 4 as internal address signals.

Row decoder 3 is responsive to the applied address signal to specify a row in the memory cell array 1. For performing this specification, a word line (not shown in FIG. 1) is selected. Column decoder 4 is responsive to the applied address signal to specify a column in memory cell array 1. For this specification, a bit line pair (not shown in FIG. 1) is selected.

In the read operation, data which is read from the selected memory cells in memory cell array 1 is transmitted to lower data I/O terminal 97 and upper data I/O terminal 98 via sense refresh amplifier and I/O control circuit 5, lower output buffer 8L and upper output buffer 8U. The data thus transmitted is specifically data DQ1–DQ16. Data transmitted to the lower and upper data I/O terminals 97 and 98 is externally output.

In the write operation, Data DQ1–DQ16 input through lower and upper data I/O terminals 97 and 98 is written into selected memory cells in the memory cell array 1 through lower and upper input buffers 7L and 7U as well as sense refresh amplifier and I/O control circuit 5.

DRAM 100A is controlled in response to a row address strobe signal $\overline{RAS}$ received through signal input terminal 91, a lower column address strobe signal $\overline{LCAS}$ received through signal input terminal 92, an upper column address strobe signal $\overline{UCAS}$ received through signal input terminal 93, a write designation signal /W received through signal input terminal 94, and an output enable signal $\overline{OE}$ received through signal input terminal 95.

Clock generating circuit 6 receives signals $\overline{RAS}$, $\overline{LCAS}$ and $\overline{UCAS}$, and generates a clock signal in response to these received signals. The clock signal sent from clock generating circuit 6 is applied to address buffer 2, row decoder 3, column decoder 4, sense refresh amplifier and I/O control circuit 5, lower output buffer 8L, upper output buffer 8U, and AND gates 11 and 12.

Address buffer 2, row decoder 3, column decoder 4, and sense refresh amplifier and I/O control circuit 5 operate in response to the applied clock signal.

Write designation signal /W is applied to AND gates 11 and 12. The output signal of AND gate 11 is applied to lower input buffer 7L and lower output buffer 8L. The output signal of AND gate 12 is applied to upper input buffer 7U and upper output buffer 8U. Output enable signal /OE is applied to lower and upper output buffers 8L and 8U.

Lower input buffer 7L operates in response to the signal applied from AND gate 11. Upper input buffer 7U operates in response to the signal applied from AND gate 12. Lower output buffer 8L operates in response to the signal sent from AND gate 11 and output enable signal /OE. Upper output buffer 8U operates in response to the signal sent from AND gate 12 and output enable signal /OE.

In DRAM 100A thus constructed, the column address is input after the row address is input. Based on the row and column addresses thus input, the word line and bit line pair are selected to select the memory cell to be accessed.

Figure 2:
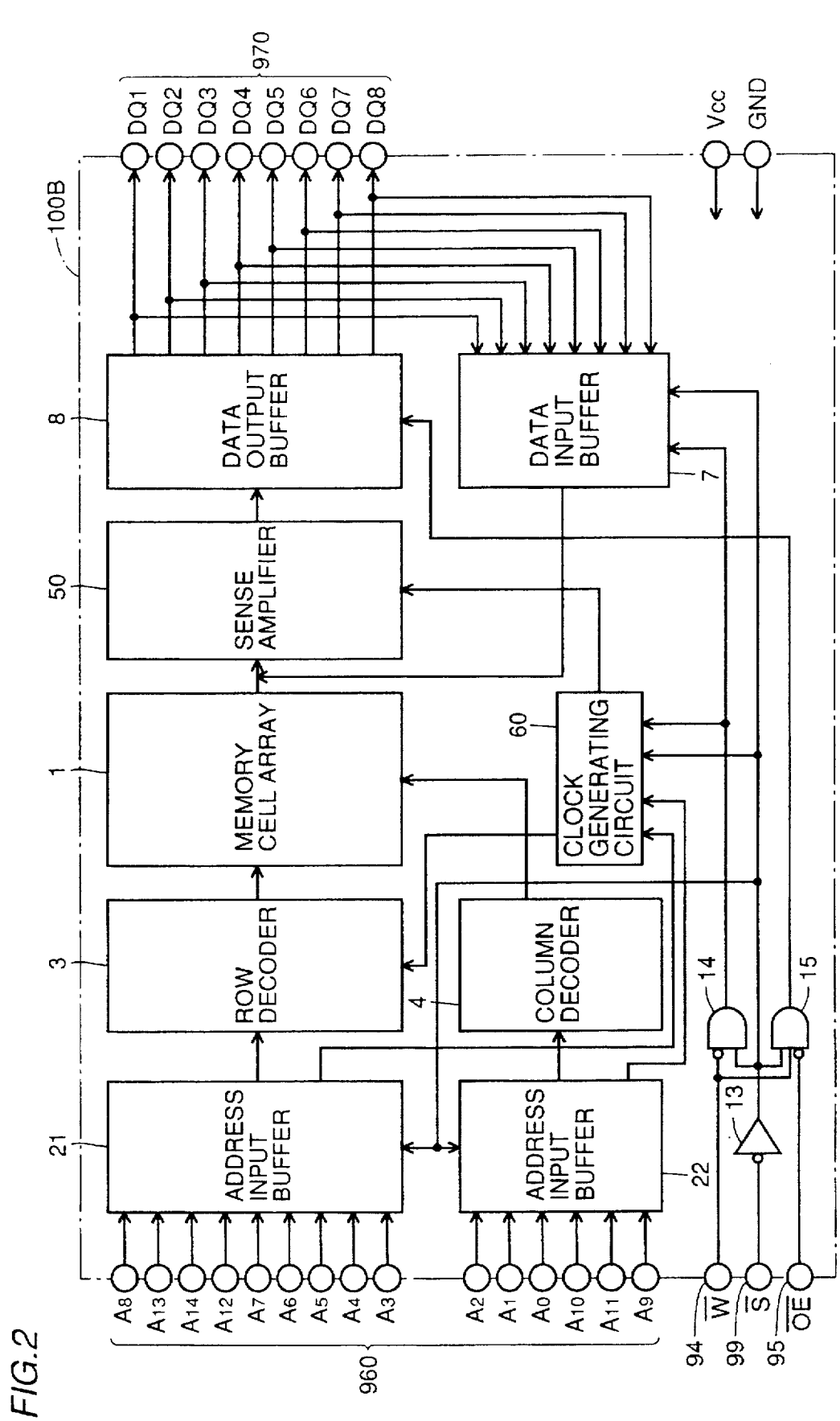
FIG. 2 is a block diagram showing a whole structure of a DRAM of an address nonmultiplex type.

Then, the DRAM of the address nonmultiplex type will be described below. FIG. 2 is a block diagram showing a whole structure of the DRAM of the address nonmultiplex type.

In FIG. 2, the same portions as those in FIG. 1 bear the same reference numbers, and will not be described below.

Referring to FIG. 2, a DRAM 100B of the address nonmultiplex type includes memory cell array 1, address input buffers 21 and 22, row decoder 3, column decoder 4, a sense amplifier 50, a data input buffer 7, a data output buffer 8, a clock generating circuit 60, an inverter 13, AND gates 14 and 15, an address input terminal 960, signal input terminals 94, 95 and 99, and data I/O terminal 970.

Address input buffer 21 receives row addresses A8, A13, ... from address input terminal 960. Address input buffer 22 receives column addresses A2, A1, ... from address input terminal 960.

Address input buffer 21 applies the received addresses to row decoder 3 and clock generating circuit 60 as the internal row address signal. Address input buffer 22 applies the received addresses to column decoder 4 and clock generating circuit 60 as the internal column address signal. Row decoder 3 and column decoder 4 have functions similar to those shown in FIG. 1.

In the read operation, data read from the selected memory cells in memory cell array 1 is sensed and amplified by sense amplifier 50, and is applied to data I/O terminal 970 through data output buffer 8. Data DQ1–DQ8 applied to data I/O terminal 970 is externally output.

In the write operation, data DQ1–DQ8 input through data I/O terminal 970 is written into selected memory cells in the memory cell array 1 through data input buffer 7.

A chip select signal /S is input through signal input terminal 99, and is applied to AND gates 14 and 15 via inverter 13. AND gate 14 also receives write designation signal /W. AND gate 15 also receives output enable signal $\overline{OE}$. The output signal of AND gate 14 is applied to clock generating circuit 60 and data input buffer 7. The output signal of AND gate 15 is applied to data output buffer 8.

The output signal of inverter 13 is applied to address input buffers 21 and 22, clock generating circuit 60 and data input buffer 7. Clock generating circuit 60 is responsive to the various input signals to generate the clock signal. The clock signal generated by clock generating circuit 60 is applied to row decoder 3 and sense amplifier 50.

Address input buffers 21 and 22 operate in response to the output signal of inverter 13. Row decoder 3 and sense amplifier 50 operate in response to the clock signal output from clock generating circuit 60. Data input buffer 7 operates in response to the output signals of AND gate 14 and inverter 13. Output buffer 8 operates in response to the output signal of AND gate 15.

In the DRAM 100B thus constructed, the row and column addresses are input simultaneously. Based on the row and column addresses which are simultaneously input, the word line and bit line are selected in the memory cell array 1, whereby the memory cell is selected.

The DRAMs shown in FIGS. 1 and 2 perform the normal operation for writing and reading data as well as the refresh operation for refreshing data accumulated in the memory cells.

Figure 3:
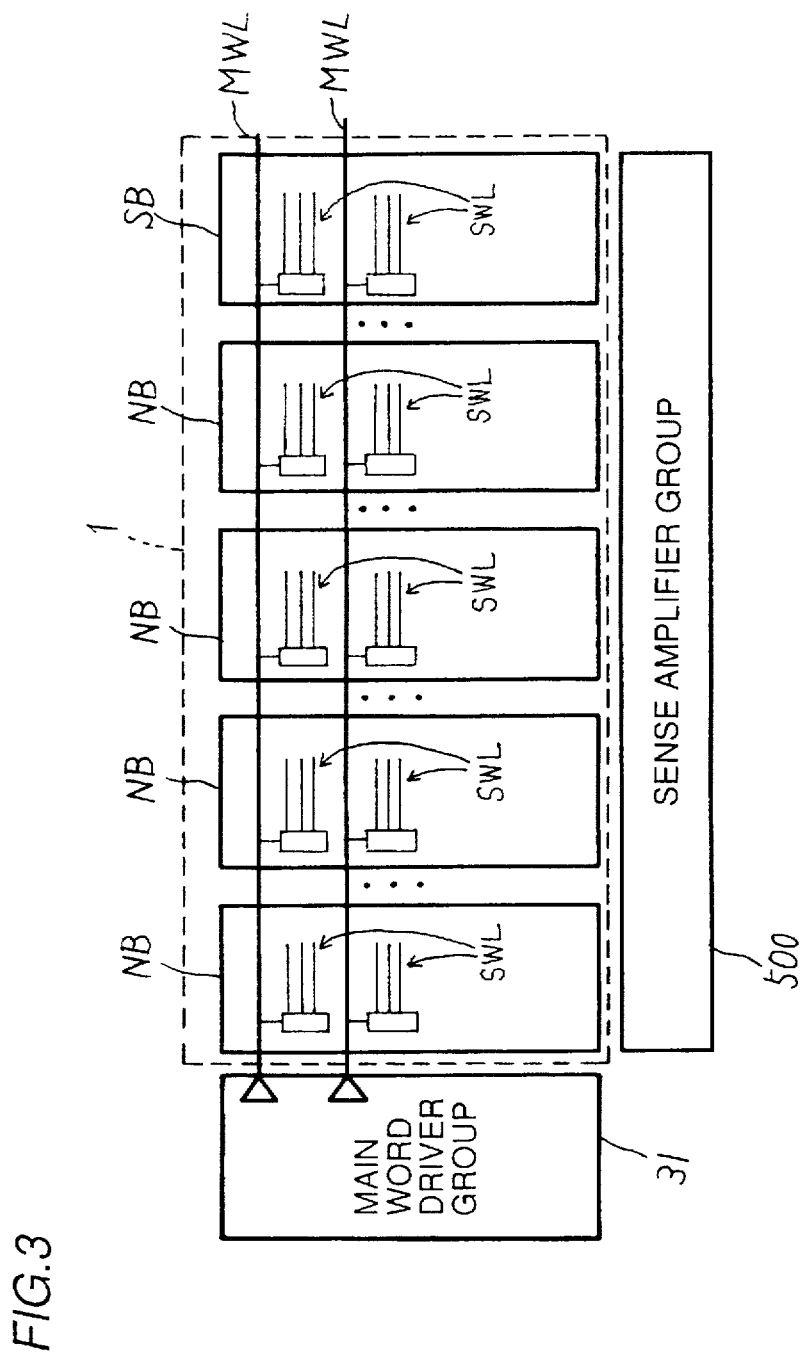
FIG. 3 is a block diagram showing a structure of a DRAM of a first embodiment.

Then, description will be given on the structure in the DRAM having the divided word lines for replacing a defective portion in units each including the memory array block. FIG. 3 is a block diagram showing the structure of the DRAM of the first embodiment.

Referring to FIG. 1, memory cell array 1 includes a plurality of normal memory array blocks NB and a spare memory array block SB. Thus, memory cell array 1 is divided into a plurality of memory array blocks.

A plurality of main word lines extend through all memory array blocks NB and SB. Each of memory array blocks NB and SB includes sub-word lines SWL connected to main word lines MWL.

Each memory array block has a specific structure which will be described later with reference to FIGS. 4, 5 and 6. Main word lines MWL are driven by a main word driver group 31. Main word driver group 31 includes a plurality of main word drivers.

Adjacent to memory cell array 1, there is disposed a sense amplifier group 500 for sensing and amplifying a potential difference in the bit line pair (not shown in FIG. 3) included in each memory array block. Sense amplifier group 500 includes a plurality of sense amplifiers.

In the DRAM thus constructed and shown in FIG. 3, when a defect occurs at any one of normal memory array blocks NB, the operation is performed to replace defective normal memory array block NB with spare memory array block SB. In this manner, the defective normal memory array block NB is repaired with spare memory array block SB in the DRAM shown in FIG. 3. This repair is achieved by rearranging the memory array blocks in the column direction.

The control in the DRAM shown in FIG. 3 has the following distinctive feature. In the manner of activating the spare sub-word line SWL, there is a difference between the address multiplex type and the address nonmultiplex type. This will be described below more specifically.

If the DRAM in FIG. 3 is of the address multiplex type, activation during either the normal operation or the refresh operation is carried out such that, when the row address is input, sub-word lines SWL in all the memory array blocks including spare memory array block SB are activated.

The reason of the above is as follows. In the DRAM of the address multiplex type, the column address is input after the row address is input. In general, the address for selecting the block is contained in the column address. In the normal operation, therefore, such operation can be performed that the input column address and the column address already programmed for replacement of the memory array block are compared with each other when the column address is input, and the memory array block to be replaced is determined based on a result of the comparison.

In the normal operation, therefore, the DRAM cannot determine whether replacement of the memory array block is performed or not at the time that the row is input. The refresh operation is performed in response to input of the row address.

In the DRAM of the address multiplex type, therefore, sub-word lines SWL in all the memory array blocks are activated both in the normal operation and refresh operation.

Meanwhile, in the DRAM of the address nonmultiplex type, the sub-word lines in all the memory array blocks are activated only during the refresh operation in contrast to the address multiplex type. The reason for this is that, since the column and row addresses are input simultaneously in the address nonmultiplex type, it is possible to determine the memory array block to be replaced at the time that the row address is input.

Owing to the above structure and control, the DRAM of the first embodiment allows replacement in units each including the memory array block in spite of the fact that the word lines are divided, and also can actually perform the refresh operation even in such a structure.

Second Embodiment

A second embodiment will be described below. The second embodiment described below is specifically related to an example in which various potential supply lines and various signal lines are hierarchized and it is possible to cut off supply of the potentials and signals to the defective memory array block.

Figure 4:
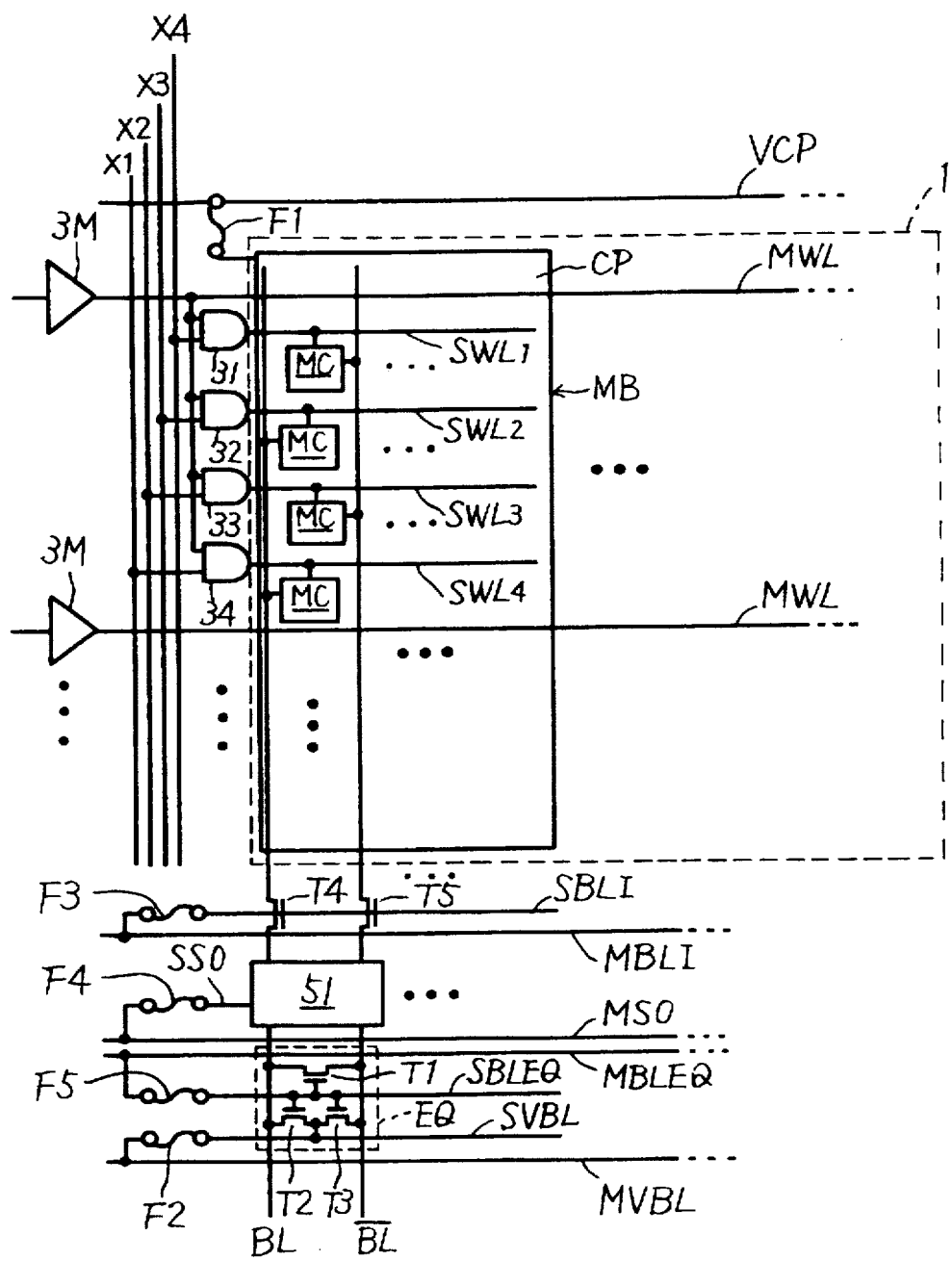
FIG. 4 is a circuit diagram showing a structure of a DRAM of a second embodiment.

FIG. 4 is a circuit diagram showing a structure of the DRAM of the second embodiment. In FIG. 4, portions similar to those in FIG. 12 bear the same reference numbers, and will not be described below. The DRAM in FIG. 4 differs from that in FIG. 12 in the following points.

A fuse F1 is arranged at a potential supply line between cell plate potential supply line VCP and cell plate CP in each memory array block MB.

A line for supplying a bit line equalization potential is divided into a bit line equalization potential main supply line MVBL and a plurality of bit line equalization potential sub-supply lines SVBL. The plurality of bit line equalization potential sub-supply lines SVBL are provided correspondingly to the plurality of memory array blocks MB, respectively.

Each potential supply line SVBL is connected to transistors T2 and T3 of each equalizer circuit EQ in the corresponding memory array block MB. A fuse F2 is arranged at a portion of each potential supply line SVBL near the bit line equalization potential main supply line MVBL.

Owing to the above structure, the bit line equalization potential is supplied from bit line equalization potential main supply line MVBL to each equalizer circuit EQ in each memory array block MB via corresponding bit line equalization potential sub-supply line SVBL provided with fuse F2.

A signal line for supplying a bit line connect/disconnect signal, which acts to make connection and disconnection between bit line pair BL and $\overline{BL}$ and sense amplifier 51, is divided to form a hierarchical structure including a bit line connect/disconnect signal main line MBL1 and a plurality of sub-bit line connect/disconnect signal sub-lines SBLI. The plurality of sub-bit line connect/disconnect signal sub-lines SBLI are provided correspondingly to the plurality of memory array blocks MB, respectively.

Each signal line SBLI is connected to a transistor pair T4 and T5 in corresponding memory array block MB. A fuse F3 is arranged at a portion of each signal line SBLI near a connection to bit line connect/disconnect signal main line MBL1.

Owing to the above structure, the bit line connect/disconnect signal is supplied to respective gate electrodes of each transistor pair T4 and T5 in each memory array block MB via corresponding sub-bit line connect/disconnect signal sub-line SBLI provided with fuse F3.

The sense amplifier activation signal line is divided to form a hierarchical structure including a bit line activation signal main line MS0 and a plurality of sense amplifier activation signal sub-lines SS0. The plurality of sense amplifier activation signal sub-lines SS0 are provided correspondingly to the plurality of memory array blocks MB, respectively.

Each signal line SS0 is connected to each sense amplifier 51 in the corresponding memory array block MB. A fuse F4 is arranged at a portion of each signal line SS0 near a connection to bit line activation signal main line MS0.

Owing to the above structure, the sense amplifier activation signal is supplied from sense amplifier activation signal main line MS0 to each sense amplifier 51 in each memory array block MB via corresponding bit line activation signal sub-line SS0 provided with fuse F4.

A bit line equalize signal line is divided to form a hierarchical structure including a bit line equalization signal main line MBLEQ and a plurality of bit line equalization signal sub-lines SBLEQ. The plurality of bit line equalization signal sub-lines SBLEQ are provided correspondingly to the plurality of memory array blocks MB.

Each signal line SBLEQ is connected to a gate electrode of a transistor T1 of each equalizer circuit EQ in the corresponding memory array block MB. A fuse F5 is arranged at a portion of each signal line SBLEQ near a connection to bit line equalization signal main line MBLEQ.

Owing to the above structure, the bit line equalization signal is supplied from bit line equalization signal main line MBLEQ to transistor T1 of each equalizer circuit EQ in each memory array block MB via the corresponding bit line equalization signal sub-line SBLEQ provided with fuse F5.

Figure 12:
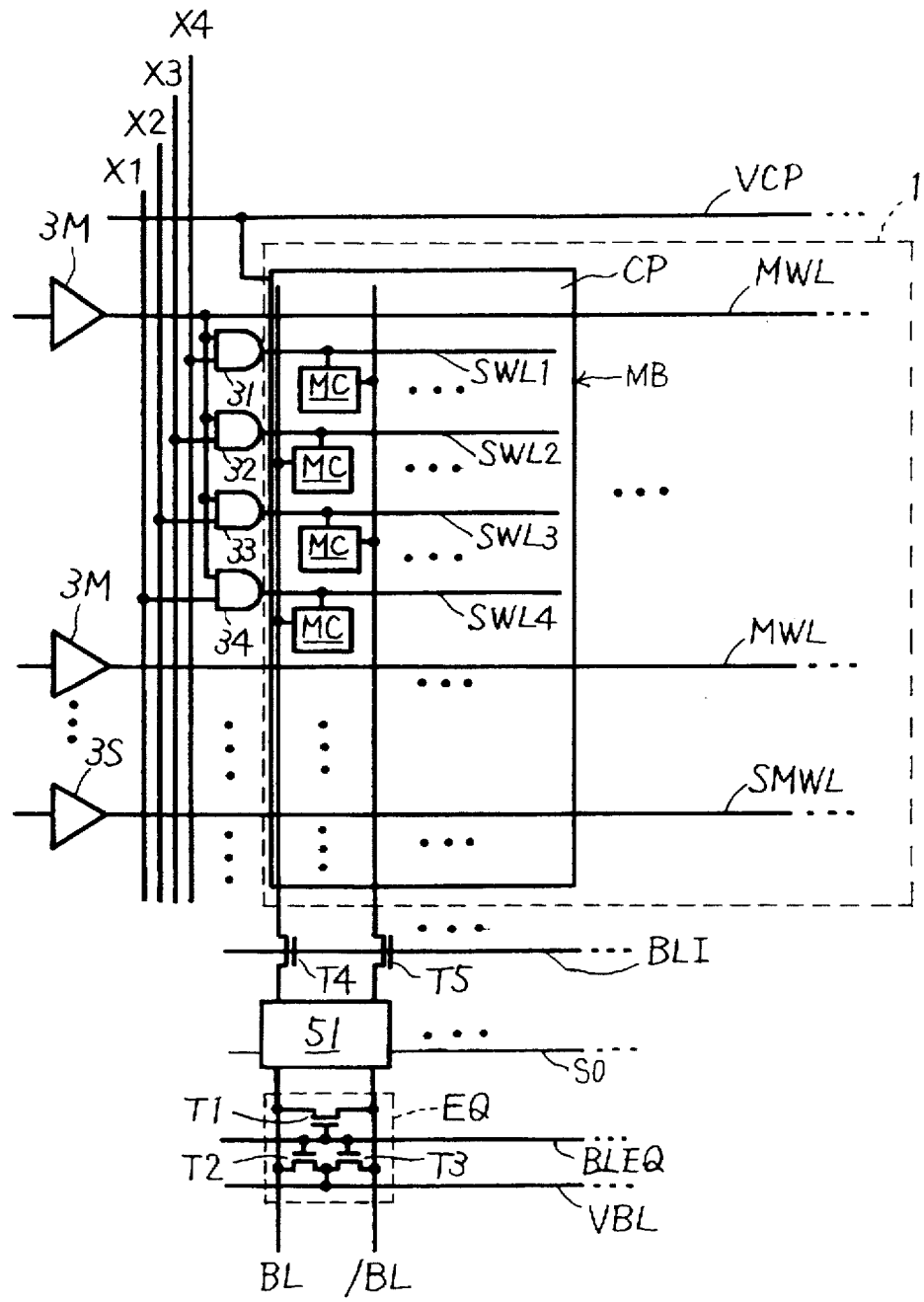
FIG. 12 is a circuit diagram showing a major structure of a conventional DRAM having divided word lines.
Figure 13:
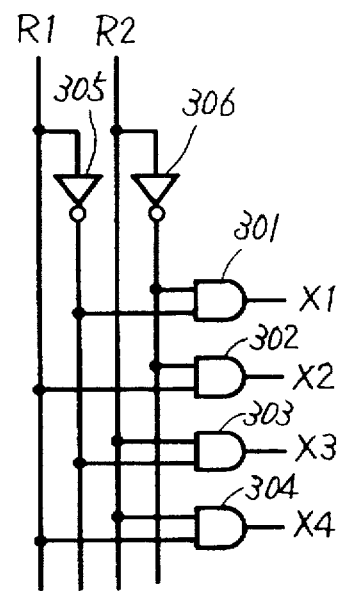
FIG. 13 is a circuit diagram showing a structure of a decode circuit of a DRAM of an address multiplex type.
Figure 14:
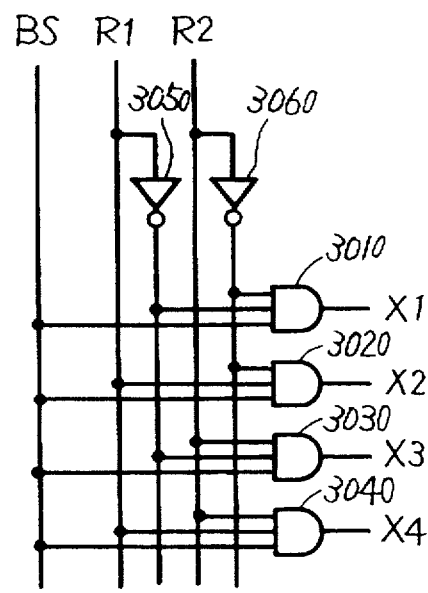
FIG. 14 is a circuit diagram showing a structure of a decode circuit of a DRAM of an address nonmultiplex type.
Figure 15:
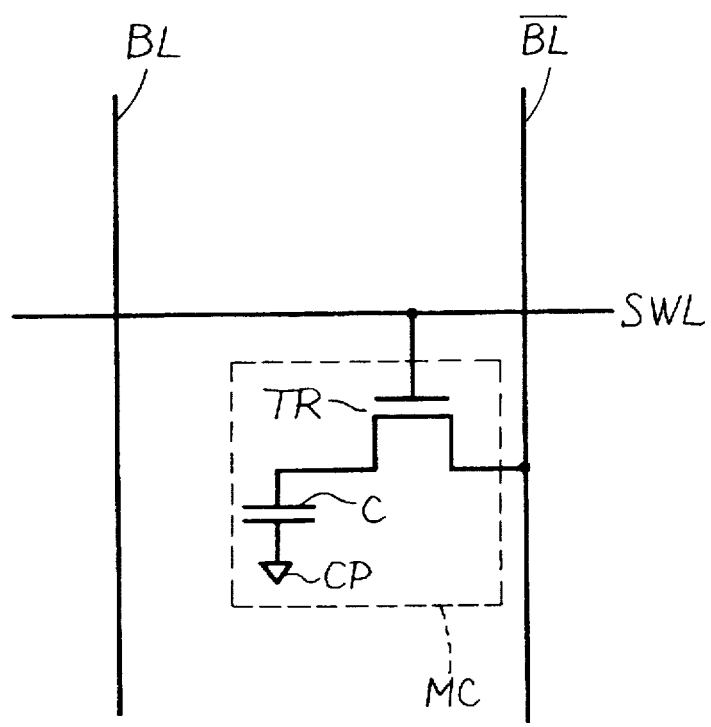
FIG. 15 is a circuit diagram showing a structure of a memory cell in a DRAM.

The DRAM in FIG. 4 is not provided with a spare word driver and a spare main word line shown in FIG. 12. The DRAM shown in FIG. 4 is provided with spare memory array block SB shown in FIG. 3. Therefore, replacement is performed in units each including the memory array block when a defect occurs at a certain memory block MB.

In the DRAM of the second embodiment thus constructed, when a defect occurs at a certain memory array block, all fuses F1–F5 corresponding to the defective memory array block are blown out.

When the fuse is blown out, a path of a leak current is not formed even in such a situation that a leak path may be formed due to short circuit between word line MWL or SWL1, ... and bit line pair BL and $\overline{BL}$ or between cell plate CP and bit line pair BL and $\overline{BL}$. Therefore, the DRAM of the second embodiment can suppress the standby current.

The above structure provided with fuses F1–F5 can be applied to both the DRAMs of the address multiplex type and address nonmultiplex type. Description will now be given on operation of the DRAM having the above structure provided with the fuses.

In the DRAM of the address multiplex type, the column address is input after the row address is input. Therefore, when the row address is input, all sub-word lines SWL1, ... connected to the main word line MWL are activated. In this case, however, various potentials and various signals are not supplied to the defective memory array block MB owing to blowout of fuses F1–F5, so that the standby current is suppressed.

In the DRAM of the address nonmultiplex type, the row and column addresses are input simultaneously. Therefore, the memory array block MB to be activated can be selected by the block select signal contained in the column address when the row address is input.

Therefore, when the block select signal selects the defective memory array block MB, address comparison is performed by the predetermined address comparing circuit. In response to a result of the comparison, the replaced spare memory array block is selected.

In this case, since the defective memory array block MB is not activated, the sub-word lines SWL1, ... in the memory array block MB are not activated. In the DRAM of the address nonmultiplex type described above, fuses F1–F5 corresponding to the defective memory array block are blown in advance, so that the standby current is suppressed.

Third Embodiment

A third embodiment will be described below. The third embodiment described below is related to an example in which transistor elements are used instead of fuses F1–F5 in the DRAM shown in FIG. 4. This structure is applied to the DRAM of the address nonmultiplex type.

Figure 5:
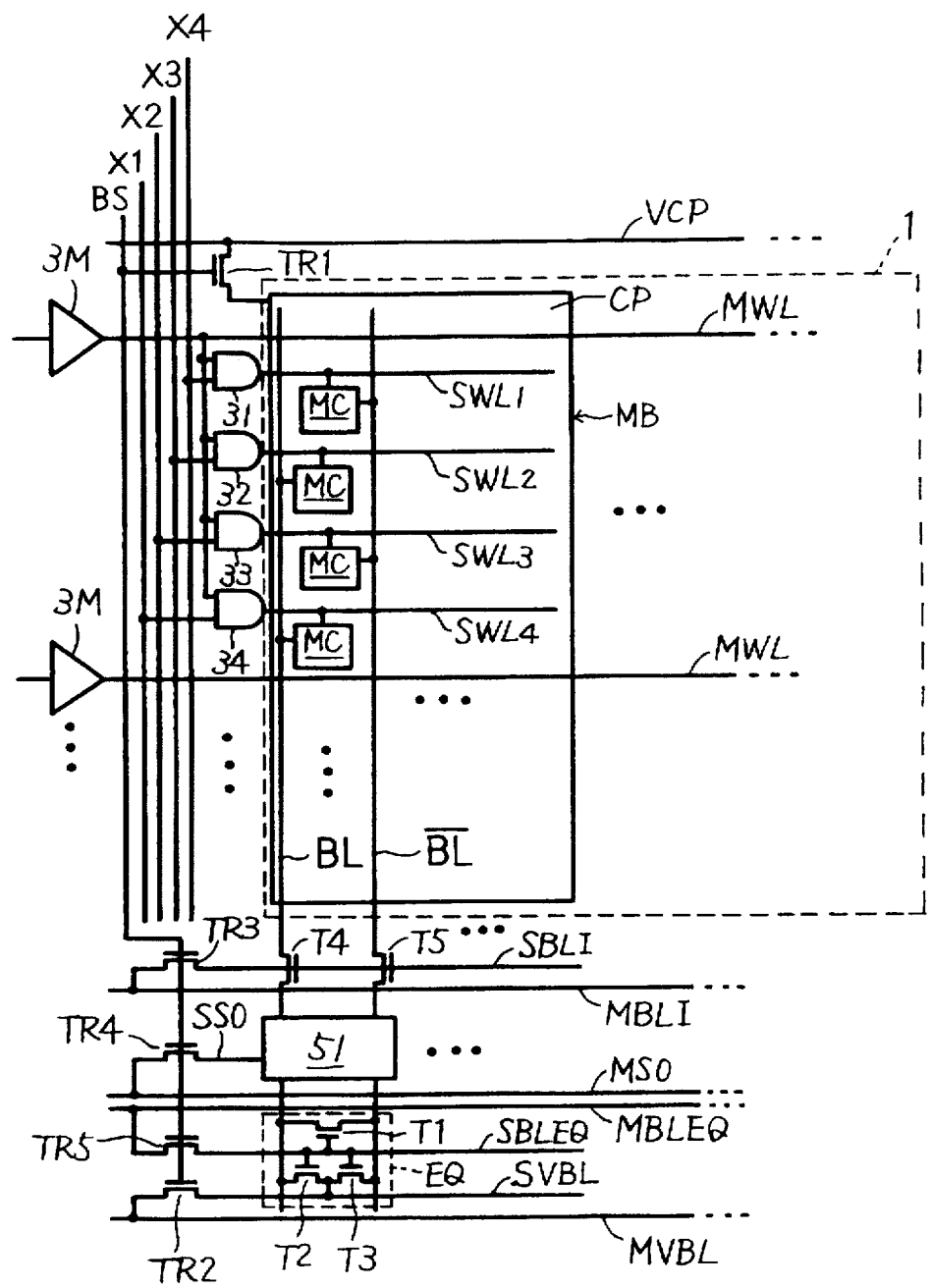
FIG. 5 is a circuit diagram showing a structure of a DRAM of a third embodiment.

FIG. 5 is a circuit diagram showing a structure of the DRAM of the third embodiment. In FIG. 5, portions similar to those in FIG. 4 bear the same reference numbers, and will not be described below.

The structure of DRAM in FIG. 5 differs from that in FIG. 4 in that NMOS transistors TR1–TR5 are provided instead of fuses F1–F5 shown in FIG. 4, and are adapted to operate in response to the block select signal BS.

Transistor TR1 is connected between the potential supply line VCP and cell plate CP. Transistor TR2 is arranged at potential supply line SVBL. Transistor TR3 is arranged at signal line SBLI. Transistor TR4 is arranged at signal line SS0. Transistor TR5 is arranged at signal line SBLEQ.

Each of transistors TR1–TR5 is supplied on its gate electrode with block select signal BS. Block select signal BS is generated based on the input column address.

The structure including transistors TR1–TR5 is applied only to the DRAM of the address nonmultiplex type because of the following reason.

In the address nonmultiplex type, since the row and column addresses are input simultaneously, it is possible to determine block select signal BS selecting memory array block MB to be activated at the time that the row address is input. Accordingly, at the time that main word line MWL is activated based on the row address, transistors TR1–TR5 corresponding to only the memory array block MB to be activated are turned on to activate the same memory array block MB.

In the DRAM of the address nonmultiplex type, defective memory array block MB is not selected, because it is to be replaced with the spare memory array block. Therefore, transistors TR1–TR5 corresponding to the defective memory array block MB are always off.

Accordingly, the defective memory array block MB is not supplied with various potentials and signals, so that the DRAM of the third embodiment can suppress the standby current.

Fourth Embodiment

A fourth embodiment will be described below. The fourth embodiment described below is related to an example in which transistors TR3–TR5 in the DRAM shown in FIG. 5 are replaced with logic gates. This structure is applied to the DRAM of the address nonmultiplex type.

Figure 6:
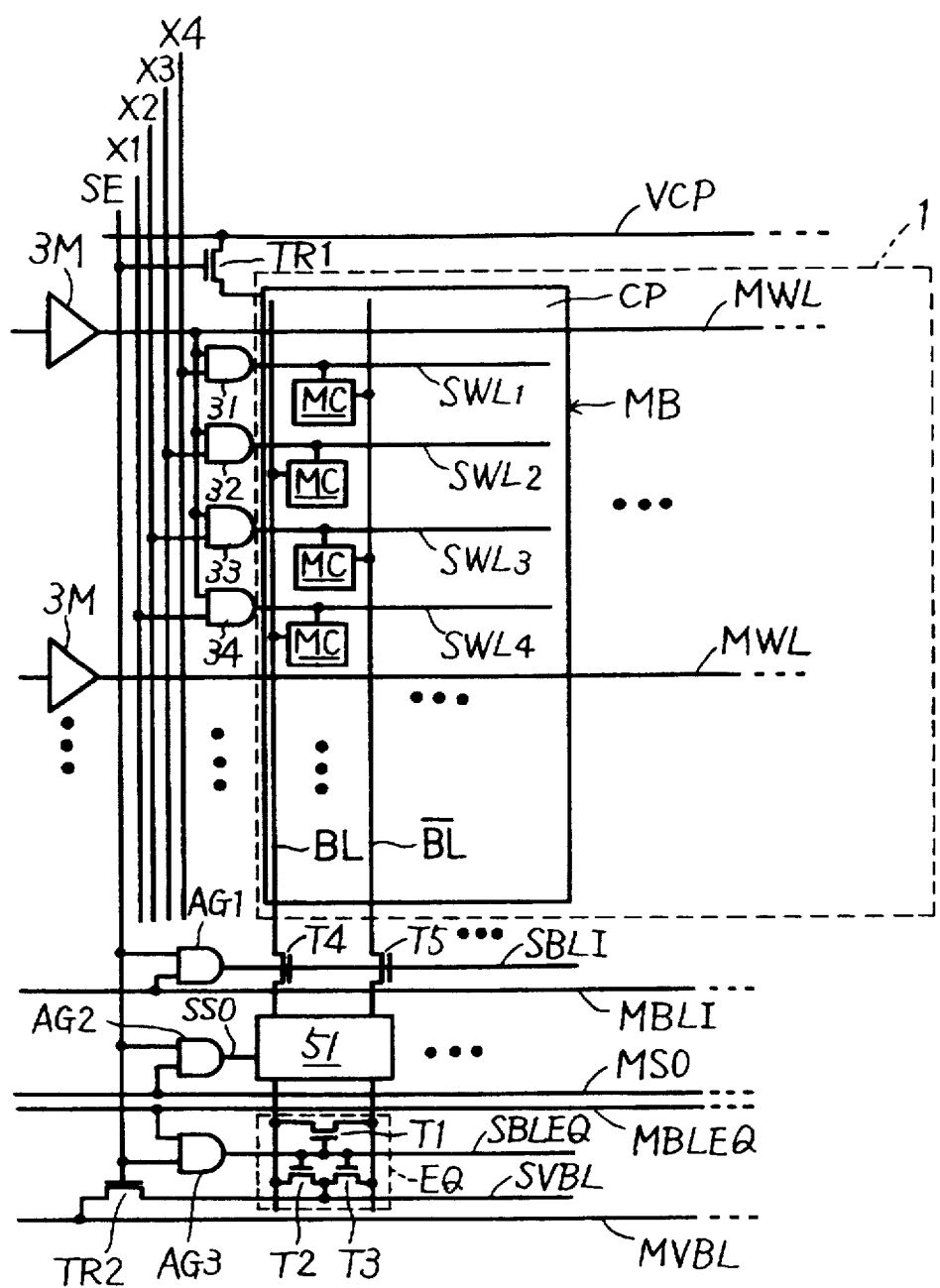
FIG. 6 is a circuit diagram showing a structure of a DRAM of a fourth embodiment.

FIG. 6 is a circuit diagram showing a structure of the DRAM of the fourth embodiment. In FIG. 6, portions similar to those in FIG. 5 bear the same reference numbers, and will not be described below.

The structure of DRAM in FIG. 6 differs from that in FIG. 5 in the following points. AND gates AG1–AG3 are provided instead of transistors TR3–TR5 shown in FIG. 5. Each of AND gates AG1–AG3 and transistors TR1 and TR2 is adapted to operate in response to a signal SE by which it is determined whether the corresponding memory array block MB is defective or not.

AND gate AG1 is interposed between signal lines MBLI and SBLI. AND gate AG1 receives a signal sent from signal line MBLI and signal SE, and supplies the output signal to signal line SBLI in response to these received signals.

AND gate AG2 is interposed between signal lines MS0 and SS0. AND gate AG2 receives a signal sent from signal line MS0 and signal SE, and supplies the output signal to signal line SS0 in response to these received signals. AND gate AG3 is interposed between signal lines MBLEQ and SBLEQ. AND gate AG3 receives a signal sent from signal line MBLEQ and signal SE, and supplies the output signal to signal line SBLEQ in response to these received signals.

Each of transistors TR1 and TR2 receives signal SE on its gate electrode, and operates in response to signal SE.

The structure including AND gates AG1–AG3 and transistors TR1 and TR2 is applied to the DRAM of the address nonmultiplex type by the following reason.

In the address nonmultiplex type, the memory array block to be activated can be determined when the row and column addresses are simultaneously input. Therefore, it is possible to determine whether the memory array block MB to be activated is defective or not when activating the main word line MWL.

In accordance with a result of determination, signal SE attains the L-level when the corresponding memory array block MB is defective. If the corresponding memory array block MB is not defective, signal SE attains the H-level. In response to this, both transistors TR1 and TR2 are turned on. Thereby, the potential is supplied from potential supply line VCP to cell plate CP, and the potential is supplied from potential supply line MVBL to potential supply line SVBL.

Further, in response to the H-level of signal SE, each of AND gates AG1–AG3 transmits the signal, which corresponds to the signal sent from the corresponding signal main line, to the corresponding signal sub-line.

When the corresponding memory array block MB is defective, signal SE attains the L-level. In response to this, both transistors TR1 and TR2 are turned off. Therefore, the potential is not supplied from potential supply line VCP to cell plate CP, and the potential is not supplied from potential supply line MVBL to potential supply line SVBL. Further, in response to the L-level of signal SE, each of AND gates AG1–AG3 applies the signal at L-level to the corresponding sub-signal line.

In this manner, the nondefective memory array block MB is activated, and the defective memory array block MB is not activated. Therefore, the defective memory array block MB is not supplied with various potentials and signals, so that the DRAM of the fourth embodiment can suppress the standby current.

In the DRAM shown in FIGS. 4 to 6, the structure in which equalizer circuit EQ is located adjacent to sense amplifier 51 has been shown. However, it is not to be taken by way of limitation. The present invention is also applicable to a DRAM having a structure in which an equalizer circuit EQ is located between paired bit lines BL and $\overline{BL}$ sandwitched by memory cell array 1 and transistors T4, T5.

Fifth Embodiment

A fifth embodiment will be described below. The fifth embodiment is related to an example in which replacement can be performed in units each including the sub-word line, when a defect occurs at a sub-word line.

Figure 7:
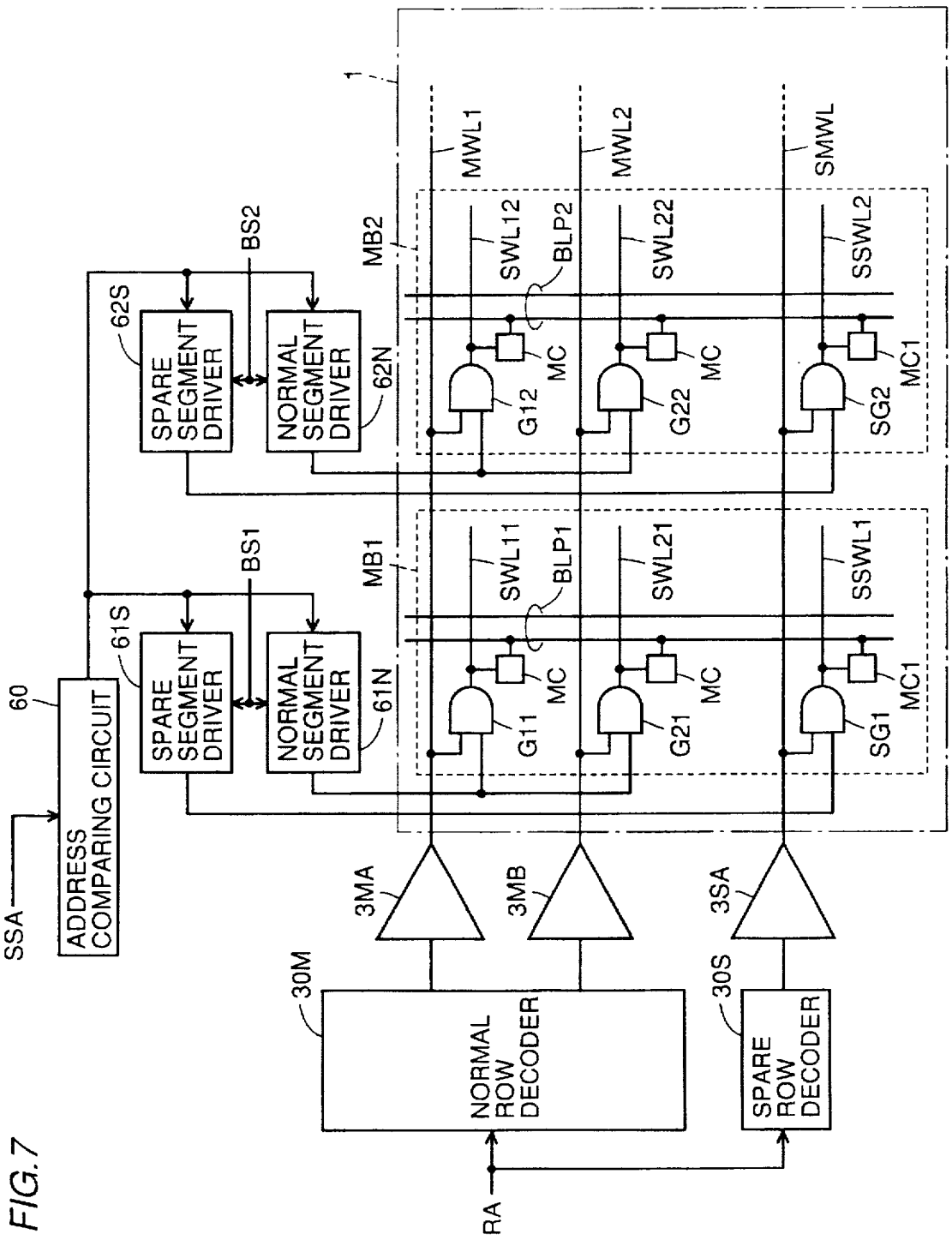
FIG. 7 is a circuit diagram showing a structure of a DRAM of a fifth embodiment.

FIG. 7 is a circuit diagram showing a structure of the DRAM of the fifth embodiment. In FIG. 7, portions similar to those in FIG. 16 bear the same reference numbers, and will not be described below.

Figure 16:
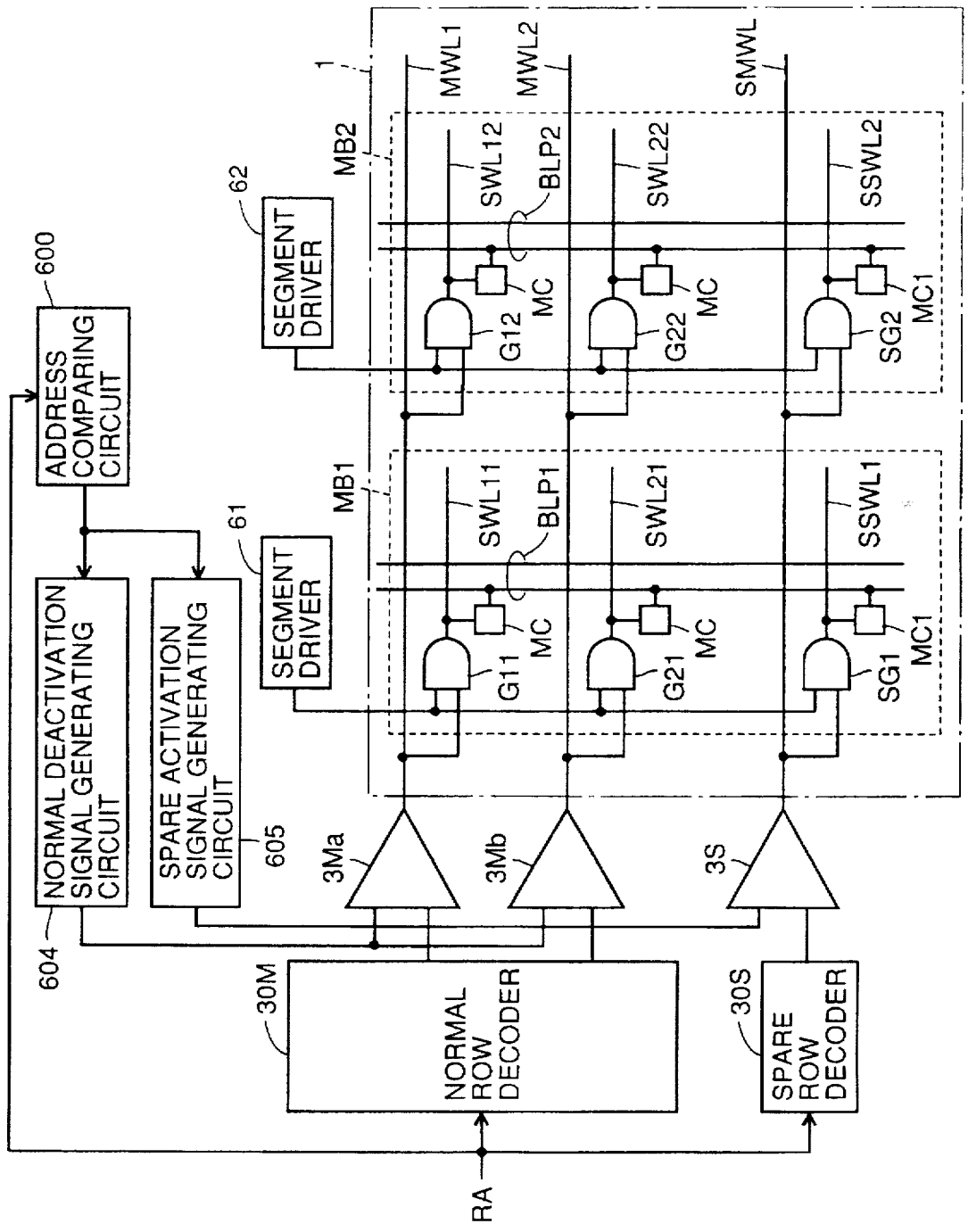
FIG. 16 is a block diagram showing a structure of a DRAM including replaceable word lines.

The DRAM in FIG. 7 differs from that in FIG. 16 in the following points. The DRAM in FIG. 7 is not provided with segment drivers 61 and 62, address comparing circuit 600, normal deactivation signal generating circuit 604 and spare activation signal generating circuit 605, and alternatively is provided with an address comparing circuit 60, spare segment drivers 61S and 62S, and normal segment drivers 61N and 62N.

Further, instead of main word drivers 3Ma and 3Mb and spare main word driver 3S, there are provided main word drivers 3MA and 3MB and a pare main word driver 3SA.

Each of main word drivers 3MA and 3MB is responsive only to the output signal of normal row decoder 30M to drive the corresponding main word line. Spare main word driver 3SA is responsive only to the output signal of spare row decoder 30S to drive spare main word line SMWL.

The address of the defective segment is programmed in address comparing circuit 60. Here, the "address of segment" is the address specifying one of sub-word lines SWL11–SWL22. Address comparing circuit 60 receives a segment select address SSA input into the DRAM, and compares the segment select address SSA and the programmed segment address.

When these addresses match each other, the address comparing circuit 60 sets the output signal to a first level. When these addresses do not match each other, the address comparing circuit 60 sets the output signal to a second level.

The output signal of address comparing circuit 60 is applied to normal segment drivers 61N and 62N and spare segment drivers 61S and 62S.

Normal segment driver 61N and spare segment driver 61S receive block select signal BS1 for the corresponding memory array block MB1. Normal segment driver 62N and spare segment driver 62S receive block select signal BS2 for the corresponding memory array block MB2. When one of the memory array blocks is selected, the block select signal corresponding to the selected block attains the H-level.

Each of the normal segment drivers 61N and 62N sets its output signal to the L-level when the signal sent from address comparing circuit 60 is at the first level and corresponding block select signal BSI is at the H-level. Meanwhile, when the signal sent from address comparing circuit 60 is at the second level and corresponding block select signal BSI is at the H-level, each of the normal segment drivers 61N and 62N sets its output signal to the H-level.

Each of the spare segment drivers 61S and 62S sets its output signal to the H-level when the signal sent from address comparing circuit 60 is at the first level and corresponding block select signal is at the H-level. Meanwhile, when the signal sent from address comparing circuit 60 is at the second level and corresponding block select signal is at the H-level, each of the spare segment drivers 61S and 62S sets its output signal to the H-level.

Normal segment driver 61N applies its output signal to sub-word drivers G11 and G21. Spare segment driver 61S applies its output signal to spare sub-word driver SG1. Normal segment driver 62N applies its output signal to sub-word drivers G12 and G22. Spare segment driver 62S applies its output signal to spare sub-word driver SG2.

Therefore, when address comparing circuit 60 does not receive segment select address SSA which matches the programmed segment address, all the sub-word lines in the selected memory array block are set to the state allowing activation. When address comparing circuit 60 receives segment select address SSA which matches the programmed segment address, the spare sub-word line in the selected memory array block is set to the state allowing activation.

In the operation, when input segment select address SSA does not match the segment address corresponding to the defective sub-word line, normal segment driver 61N or 62N selects the normal sub-word line. In this case, main word line MWL1 or MWL2 is selectively activated in accordance with the input row address. Thereby, the normal sub-word line is activated.

Spare main word line SMWL1 is always activated by spare row decoder 30S and spare main word driver 3SA.

When input segment select address SSA matches the segment address corresponding to the defective sub-word line, spare segment driver 61S or 62S selects the spare sub-word line. Since spare sub-word line SMWL is always active, the spare sub-word line is activated.

According to the above structure in which spare main word line SMWL is always active, address comparison for activating spare main word line SMWL is not required, which increases the operation speed.

Although the description has been given on the example in which spare main word line SMWL is always active, such a control may be employed that the row address corresponding to the defective sub-word line is precedingly programmed in spare row decoder 30S, and the input row address and the programmed row address are compared with each other, so that spare main word line SMWL is activated only when these addresses match each other.

In the DRAM shown in FIG. 7, it is necessary to determine which of normal sub-word line or spare sub-word line is to be selected at the time that the row address is input.

In the address nonmultiplex type, since the row and column addresses are input simultaneously, the above requirement can be met. In the address multiplex type, since the column address is input after the input of row address, the above requirement can be met only when segment select address SSA can be specified by the row address.

Figure 8:
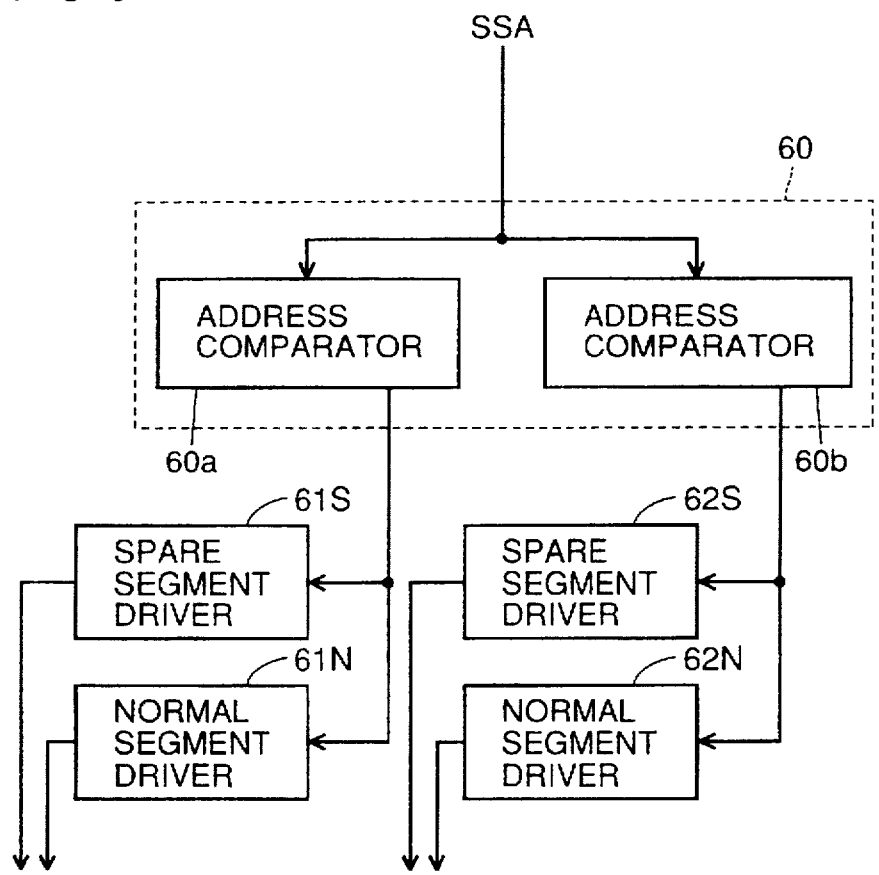
FIG. 8 is a block diagram of an address comparing circuit in a DRAM of an address multiplex type.

In the address nonmultiplex type, if the replacement is performed in sub-word lines as shown in FIG. 7, the address comparing circuit 60 must have a structure shown in FIG. 8.

FIG. 8 is a block diagram of the address comparing circuit in the DRAM of the address multiplex type.

Referring to FIG. 8, address comparing circuit 60 must include an address comparator 60a, which corresponds to normal segment driver 61N and spare segment driver 61S, and an address comparator 60b, which corresponds to normal segment driver 62N and spare segment driver 62S. Thus, it is necessary to perform independent comparison of the segment address for each memory array block.

In the address multiplex type, the block select address is not yet input and thus the block to be activated cannot be determined when the row address is input. Therefore, it is necessary to make independent comparison of segment addresses for each memory array block. Therefore, the segment address corresponding to the defective sub-word line in the corresponding memory array block is programmed in each of address comparators 60a and 60b.

Since the DRAM of the fifth embodiment can perform replacement in sub-word lines, the efficiency of replacement of word line can be increased.

In addition, in the DRAM of the fifth embodiment, structures for cutting off the supply of cell plate potential, bit line equalization potential, bit line equalization signal, bit line connect/disconnect signal, and sense amplifier activation signal may be adopted, as in the case of the first to fourth embodiments. Thus, suppression of standby current as described above is made possible.

Sixth Embodiment

A sixth embodiment will be described below. The sixth embodiment is related to an example in which replacement of sub-word line can be performed also by using the spare sub-word lines connected to the main word lines and spare main word line.

Figure 9:
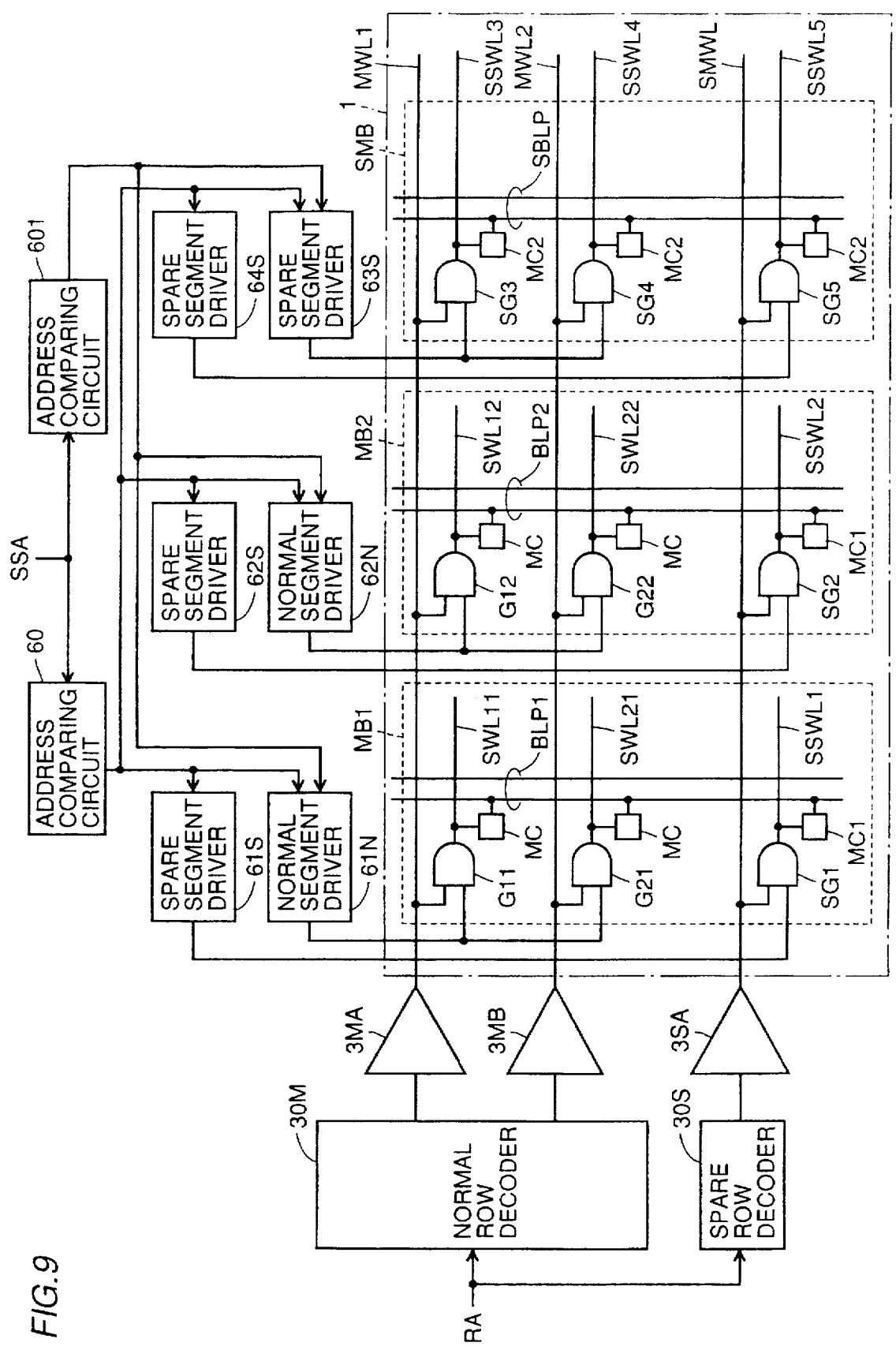
FIG. 9 is a circuit diagram showing a structure of a DRAM of a sixth embodiment.

FIG. 9 is a circuit diagram showing a structure of the DRAM of the sixth embodiment. In FIG. 9, portions similar to those in FIG. 7 bear the same reference numbers, and will not be described below.

The DRAM in FIG. 9 differs from that in FIG. 7 in the following points. The DRAM is additionally provided with a spare memory array block SMB, an address comparing circuit 601 and spare segment drivers 63S and 64S.

Spare memory array block SMB includes spare sub-word lines SSWL3–SSWL5, a spare bit line pair SBLP, spare memory cells MC2, . . . , and spare sub-word drivers SG3–SG5.

In memory array block SMB, main word line MWL1 is connected to spare sub-word line SSWL3 via spare sub-word driver SG3. Main word line MWL2 is connected to spare sub-word line SSWL4 via spare sub-word driver SG4. Spare main word line SMWL is connected to spare sub-word line SSWL5 via spare sub-word driver SG5.

Spare bit line pair SBLP crosses spare sub-word lines SSWL3–SSWL5. Spare memory cells MC2 are arranged at crossings between spare bit line pair SBLP and respective spare sub-word lines SSWL3–SSWL5. Each of spare memory cell MC2 is connected to the spare sub-word line and spare bit line pair SBLP forming the corresponding crossing.

The address of the defective segment is programmed in address comparing circuit 601. Address comparing circuit 601 receives segment select address SSA input to the DRAM, and compares segment select address SSA with the programmed segment address.

Address comparing circuit 601 sets its output signal to the first level when these addresses match each other, and sets its output signal to the second level when these addresses do not match each other. The output signal of address comparing circuit 601 is applied to normal segment drivers 61N and 62N and spare segment driver 63s.

Spare segment driver 63S is provided correspondingly to spare sub-word drivers SG3 and SG4.

Spare segment driver 64S is provided correspondingly to spare sub-word driver SG5. Spare segment driver 63S can operate similarly to normal segment drivers 61N and 62N in response to the output signal of address comparing circuit 60, and sets its output signal to the H-level when the output signal of address comparing circuit 601 is at the first level. Thereby, spare sub-word line SSWL3 or SSWL4 can be activated when a defect occurs at the sub-word line in the memory array block MB1 or MB2.

Each of normal segment drivers 61N and 62N also operates in response to the output signal of address comparing circuit 601. More specifically, when the output signal of address comparing circuit 601 is at the first level, it outputs the signal at the L-level to disable the corresponding sub-word line. Spare segment driver 64S receives the output signal of address comparing circuit 60, and can operate similarly to spare segment drivers 61S and 62S.

In the DRAM shown in FIG. 9, as described above, each of sub-word lines SWL11 and SWL12 can also be replaced with spare sub-word line SSWL3, and each of sub-word lines SWL21 and SWL22 can also be replaced with spare sub-word line SSWL4. For example, sub-word line SSW11 can be replaced with either spare sub-word line SSW1 or SSWL3.

As described above, the DRAM of the sixth embodiment can perform replacement in sub-word lines, and the degree of freedom in the replacement can be higher than that in the DRAM of the fifth embodiment.

FIG. 9 shows the structure of the DRAM of the address nonmultiplex type. This structure can be applied to the DRAM of the address nonmultiplex type, in which case each of address comparing circuits 60 and 601 must include the address comparator corresponding to the memory array block as already described in connection with the fifth embodiment. Further, it is necessary that the segment select address can specify the row address as already described.

Seventh Embodiment

A seventh embodiment will be described below. The seventh embodiment is related to an example in which the address comparing operation by the address comparing circuit can be performed in parallel with the operation of amplifying data by the sense amplifier.

Figure 10:
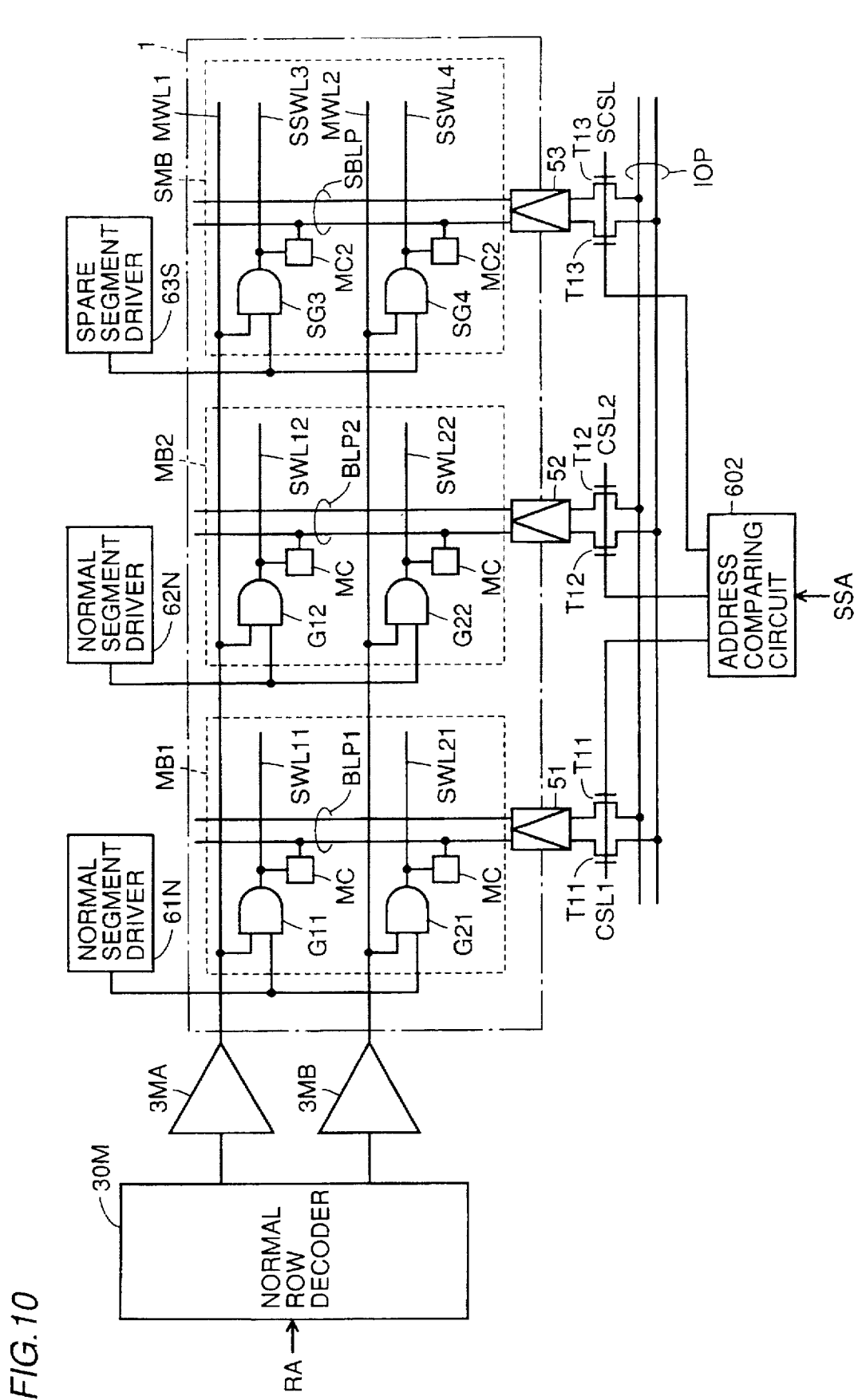
FIG. 10 is a circuit diagram showing a structure of a DRAM of a seventh embodiment.

FIG. 10 is a circuit diagram showing a structure of the DRAM of the seventh embodiment. In FIG. 10, portions similar to those in FIG. 9 bear the same reference numbers, and will not be described below.

The DRAM in FIG. 10 differs from that in FIG. 9 in the following points. The DRAM in FIG. 10 is not provided with a spare main word line. Therefore, structural elements related to the spare main word line are not provided. Further, an address comparing circuit 602 operates in a manner different from that of the address comparing circuit shown in FIG. 9.

In FIG. 10, there are also shown a plurality of sense amplifiers 51–53, a plurality of transistor pairs T11–T13, and an I/O line pair IOP.

Data transmitted onto bit line pair BLP1 is sensed and amplified by sense amplifier 51, and is transmitted onto I/O line pair IOP via transistor pair T11. Data transmitted onto bit line pair BLP2 is sensed and amplified by sense amplifier 52, and is transmitted onto I/O line pair IOP via transistor pair T12.

Data transmitted onto spare bit line pair SBLP is sensed and amplified by sense amplifier 53, and is transmitted onto I/O line pair IOP via transistor pair T13.

Each of transistors T11–T13 is an NMOS transistor. Each gate in transistor pair T11 is connected to a column select line CSL1. Each gate in transistor pair T12 is connected to a column select line CSL2. Each gate in transistor pair T13 is connected to a spare column select line SCSL.

During operation, each of normal segment drivers 61N and 62N and spare segment driver 63S always sets its output signal to the H-level. Therefore, all sub-word drivers G11–G22 and spare sub-word drivers SG3 and SG4 can be activated during the operation.

A segment address corresponding to the defective sub-word line is programmed in address comparing circuit 602. Address comparing circuit 602 compares input segment select address SSA with the programmed segment address.

When these addresses do not match each other, address comparing circuit 602 sets column select line CSL1 or CSL2 corresponding to the segment select address to the H-level. When these addresses match each other, address comparing circuit 602 sets spare column select line SCSL to the H-level. Thus, address comparing circuit 602 selectively activates column select lines CSL1 and CSL2 and spare column select line SCSL.

In the DRAM thus constructed in FIG. 10, sub-word line SWL11 or SWL12 can be replaced with spare sub-word line SSWL3, and sub-word line SWL21 or SWL22 can be replaced with spare sub-word line SSWL4.

Operation of the DRAM in FIG. 10 will be described below. Normal segment drivers 61N and 62N and spare segment driver 63S enable activation of sub-word drivers G11–G22 and spare sub-word drivers SG3 and SG4. Main word line MWL1 or MWL2 is selectively activated.

Accordingly, all the sub-word lines and spare word line corresponding to the activated main word line are activated. Thereby, data are transmitted onto bit line pairs BLP1 and BLP2 and spare bit line pair BLP, respectively. The data are amplified by sense amplifiers 51–53, respectively.

During a period from the above activation of the sub-word lines and spare sub-word line to completion of data amplification by sense amplifiers 51–53, address comparing circuit 602 performs the address comparing operation in parallel with the above operation.

Immediately after completion of the amplification by the sense amplifiers 51–53, address comparing circuit 602 selectively activates column select lines CSL1 and CSL2 and spare column select line SCSL, so that one kind of amplified data is transmitted onto I/O line pair IOP.

In connection with the manner of the above operation, there is a difference between the address multiplex type and the address nonmultiplex type. In the address nonmultiplex type, the memory array block to be activated is determined when the row address is input, so that data is transmitted onto the bit line pair BLP1 or BLP2 in the memory array block to be activated and spare bit line pair SBLP.

Meanwhile, in the address nonmultiplex type, since the memory array block to be activated is not yet determined when the row address is input, so that data is transmitted onto both bit line pairs BLP1 and BLP2 and spare bit line pair SBLP.

As described above, the DRAM in FIG. 10 can perform replacement in sub-word lines, so that the efficiency of replacement of the word line can be increased. Further, the data amplifying operation by respective sense amplifiers 51–53 is performed in parallel with the address comparing operation by address comparing circuit 602, so that the operation speed can be increased.

Eighth Embodiment

An eighth embodiment will be described below. The eighth embodiment is a modification of the seventh embodiment, and is related to an example in which data amplified by a plurality of sense amplifiers are transmitted onto a plurality of I/O line pairs, and are selectively output by a multiplexer.

Figure 11:
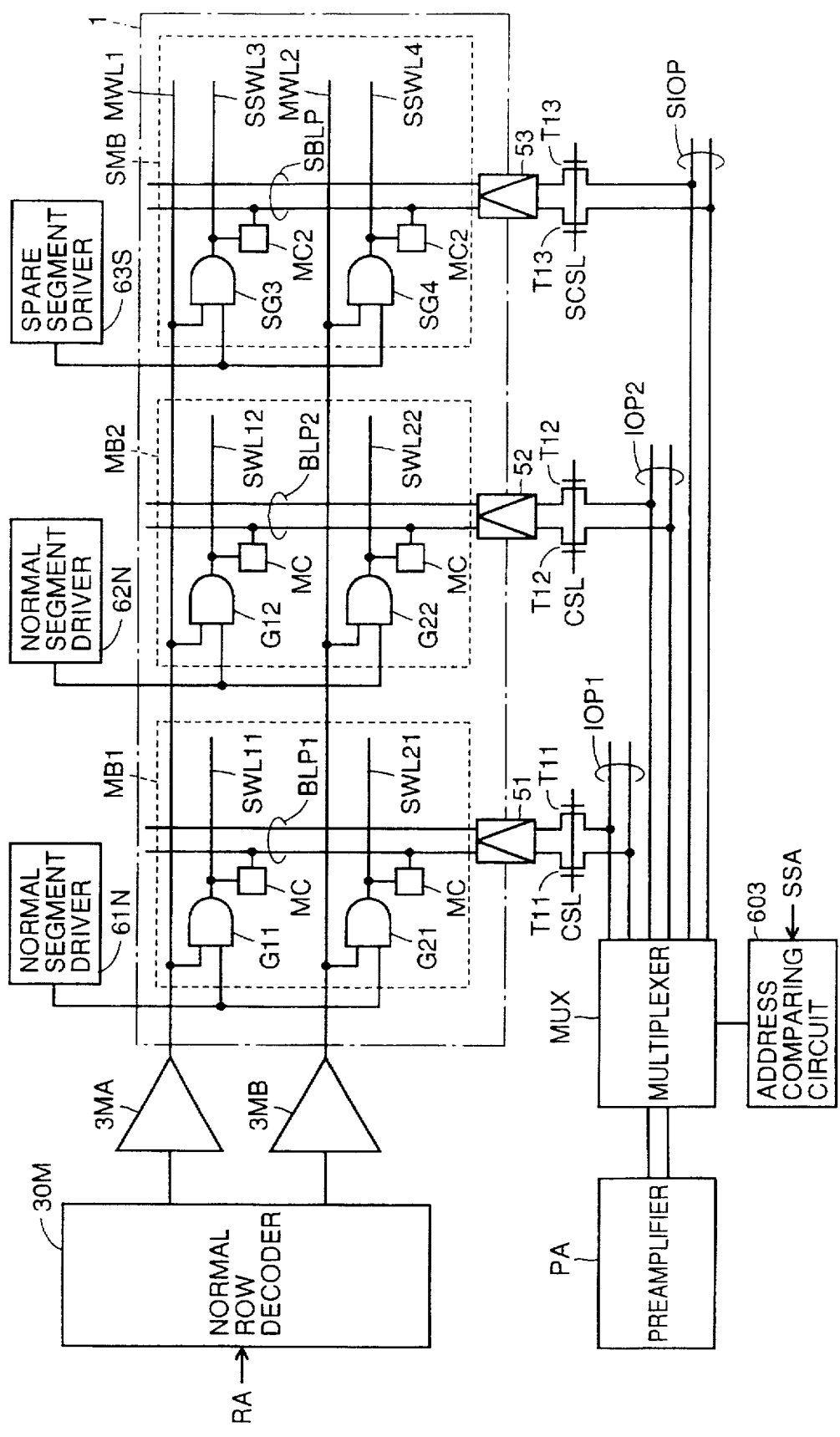
FIG. 11 is a circuit diagram showing a structure of a DRAM of an eighth embodiment.

FIG. 11 is a circuit diagram showing a structure of the DRAM of the eighth embodiment. In FIG. 11, portions similar to those in FIG. 10 bear the same reference numbers, and will not be described below.

The DRAM in FIG. 11 differs from that in FIG. 10 in the following points. I/O line pairs IOP1 and IOP2 and spare I/O line pair SIOP are provided correspondingly to bit line pairs BLP1 and BLP2 and spare bit line pair SBLP, respectively. Column select lines CSL1 and CSL2 and spare column select line SCSL are activated simultaneously.

A segment address corresponding to the defective sub-word line is programmed in an address comparing circuit 603. Address comparing circuit 603 compares input segment select address SSA with the programmed segment address, and applies information indicative of the result of comparison to a multiplexer MUX.

Multiplexer MUX is connected to I/O line pairs IOP1 and IOP2 and spare I/O line pair SIOP. Multiplexer MUX selectively applies data transmitted onto the I/O line pairs to a preamplifier PA in response to the information indicative of the result of comparison sent from address comparing circuit 603. Then, operation of the DRAM in FIG. 11 will be described below. More specifically, a difference in the operation with respect to the DRAM in FIG. 10 will be described below.

By activating the sub-word lines and the spare sub-word line corresponding to the activated main word line, data transmitted onto bit line pairs BLP1 and BLP2 and spare bit line pair SBLP are amplified by sense amplifiers 51–53 and are transmitted via the corresponding transistor pairs onto I/O line pairs IOP1 and IOP2 and spare I/O line pair SIOP, respectively.

During a period after activation of the sub-word lines and spare sub-word line in this manner and before completion of transmission of data onto I/O line pairs IOP1 and IOP2 and spare I/O line pair SIOP, address comparing circuit 603 performs the address comparing operation in parallel with the above operation.

Immediately after completion of the transmission of data onto I/O line pairs IOP1 and IOP2 and spare I/O line pair SIOP, multiplexer MUX applies to preamplifier PA the data transmitted onto one of I/O line pairs IOP1 and IOP2 and spare I/O line pair IOP.

The address multiplex type and the address nonmultiplex type differs from each other in the manner of reading data in the above operation. In the address nonmultiplex type, the memory array block to be activated is determined when the row address is input. Therefore, data are transmitted onto I/O line pair IOP1 or IOP2 and spare I/O line pair SIOP corresponding to the memory array block to be activated.

Meanwhile, in the address nonmultiplex type, the memory array block to be activated is not yet determined when the row address is input. Therefore, data is transmitted onto both bit I/O line pairs IOP1 and IOP2 and spare I/O line pair SIOP.

As described above, the DRAM in FIG. 11 can perform replacement in sub-word lines, so that the efficiency of replacement of the word line can be increased. Further, the operation of transmitting data onto bit I/O line pairs IOP1 and IOP2 and spare I/O line pair SIOP is performed in parallel with the address comparing operation by address comparing circuit 603, so that the operation speed can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array having a plurality of dynamic memory cells and divided into a plurality of memory array blocks; and
   a plurality of main word lines extending through said plurality of memory array blocks, wherein
   each of said plurality of memory cells includes a memory transistor and a memory capacitor;
   each of said plurality of memory array blocks includes:
   a plurality of sub-word lines connected to said plurality of memory cells in said memory array block, and connected to said plurality of main word lines, and
   a cell plate divided correspondingly to said plurality of memory array blocks, and forming a common electrode of said memory capacitors of said plurality of memory cells in each of said memory array blocks; and
   said semiconductor memory device further comprises:
   a cell plate potential supply line for supplying a cell plate potential to said cell plates in said plurality of memory array blocks, and
   a plurality of cut-off means arranged between said cell plates in said plurality of memory array blocks and said cell plate potential supply line, respectively, and provided for cutting off the supply of said cell plate potential to a defective one among said memory array blocks.

2. The semiconductor memory device according to claim 1, wherein all or a part of said plurality of cut-off means are formed of fuse elements.

3. The semiconductor memory device according to claim 1, wherein all or a part of said plurality of cut-off means are formed of transistor elements.

4. The semiconductor memory device according to claim 3, wherein the operation of said transistor elements is controlled by a signal used for selecting said memory array block.

5. The semiconductor memory device according to claim 3, wherein the operation of said transistor element is controlled by a signal indicative of a result of determination whether the corresponding memory array block is defective or not.

6. The semiconductor memory device according to claim 1, wherein
   a column address is input after input of a row address, and said plurality of sub-word lines are activated selectively in all of said plurality of memory array blocks in relation to the input of the row address.

7. The semiconductor memory device according to claim 1, wherein
   a row address and a column address are input simultaneously, and said plurality of sub-word lines are activated selectively in the selected memory array block among said plurality of memory array blocks in relation to input of the row address and the column address.

8. A semiconductor memory device comprising:
   a memory cell array having a plurality of dynamic memory cells and divided into a plurality of memory array blocks;
   a plurality of main word lines extending through said plurality of memory array blocks; and
   a plurality of bit line pairs arranged in each of said plurality of memory array blocks along a direction crossing said main word lines and connected to said plurality of memory cells in the corresponding memory array blocks, wherein
   each of said plurality of memory array blocks includes a plurality of sub-word lines connected to said plurality of memory cells in said memory array block and connected to said plurality of main word lines; and
   said semiconductor memory device further comprises:
   a plurality of equalizer means provided correspondingly to said plurality of bit line pairs and each provided for equalizing potentials on the corresponding bit line pair;
   an equalization control signal main supply line arranged along said plurality of memory array blocks and provided for supplying an equalization control signal for controlling said plurality of equalizer means;
   a plurality of equalization control signal sub-supply lines provided correspondingly to said plurality of memory array blocks, respectively, and each provided for transmitting said equalization control signal supplied from said equalization control signal main supply line to each of said equalizer means equalizing said plurality of bit line pairs in the corresponding memory array block; and
   a plurality of cut-off means provided correspondingly to said plurality of equalization control signal sub-supply lines, respectively, and being operable to cut off the supply of said equalization control signal from said equalization control signal main supply line to said equalization control signal sub-supply line corresponding to defective one among said memory array blocks.

9. The semiconductor memory device according to claim 8, wherein all of a part of said cut-off means is formed of logic means.

10. The semiconductor memory device according to claim 9, wherein said logic means receives a signal sent from the corresponding signal supply line as well as a signal indicative of a result of determination whether the corresponding memory array block is defective or not, and is controlled in response to these signals.

11. The semiconductor memory device according to claim 8, wherein
   a column address is input after input of a row address, and said plurality of sub-word lines are activated selectively in all of said plurality of memory array blocks in relation to input of the row address.

12. The semiconductor memory device according to claim 8, wherein
   a row address and a column address are input simultaneously, and said plurality of sub-word lines are activated selectively in the selected memory array block among said plurality of memory array blocks in relation to input of the row address and the column address.

13. The semiconductor memory device according to claim 8, further comprising:
   a plurality of sense amplifier means provided correspondingly to said plurality of bit line pairs, respectively, and each being operable to sense and amplify a potential difference on the corresponding bit line pair; and
   a plurality of switching means provided correspondingly to respective ones of said plurality of bit line pairs, between said memory cell array and said plurality of sense amplifier means, and each provided for switching the state of connection between the corresponding said bit line pair and said sense amplifier means, wherein
   said plurality of equalizer means are provided between said memory cell array and said plurality of switching means.

14. A semiconductor memory device comprising:
   a memory cell array having a plurality of dynamic memory cells and divided into a plurality of memory array blocks;
   a plurality of main word lines extending through said plurality of memory array blocks; and
   a plurality of bit line pairs arranged in each of said plurality of memory array blocks along a direction crossing said main word lines and connected to said plurality of memory cells in the corresponding memory array blocks, wherein
   each of said plurality of memory array blocks includes a plurality of sub-word lines connected to said plurality of memory cells in said memory array block and connected to said plurality of main word lines; and
   said semiconductor memory device further comprises:
   a plurality of sense amplifier means provided correspondingly to said plurality of bit line pairs and each being operable to sense and amplify a potential difference on the corresponding bit line pair;
   a plurality of switching means arranged between the corresponding bit line pairs and said sense amplifier means, respectively, and being operable to switch a state of connection between them;
   a switching control signal main supply line arranged along said plurality of memory array blocks and being operable to supply a switching control signal for controlling said plurality of switching means;
   a plurality of switching control signal sub-supply lines provided correspondingly to said plurality of memory array blocks, respectively, and each being operable to transmit said switching control signal supplied from said switching control signal main supply line to said plurality of switching means corresponding to said plurality of bit line pairs in the corresponding memory array block; and
   a plurality of cut-off means provided correspondingly to said plurality of switching control signal sub-supply lines, respectively, and each being operable to cut off the supply of said switching control signal sent from said switching control signal main supply line to said switching control signal sub-supply line corresponding to defective one among said memory array blocks.

15. The semiconductor memory device according to claim 14, wherein
   a column address is input after input of a row address, and said plurality of sub-word lines are activated selectively in all of said plurality of memory array blocks in relation to input of the row address.

16. The semiconductor memory device according to claim 14, wherein
   a row address and a column address are input simultaneously and said plurality of sub-word lines are activated selectively in the selected memory array block among said plurality of memory array blocks in relation to input of the row address and the column address.

17. A semiconductor memory device comprising:
   a memory cell array having a plurality of dynamic memory cells and divided into a plurality of memory array blocks;
   a plurality of main word lines extending through said plurality of memory array blocks;
   a plurality of bit line pairs arranged in each of said plurality of memory array blocks along a direction crossing said main word lines and connected to said plurality of memory cells in the corresponding memory array blocks, wherein
   each of said plurality of memory array blocks includes a plurality of sub-word lines connected to said plurality of memory cells in said memory array block and connected to said plurality of main word lines;
   said semiconductor memory device further comprises:
   a plurality of equalizer means provided correspondingly to said plurality of bit line pairs and each provided for equalizing potentials on the corresponding bit line pair;
   an equalization potential main supply line arranged along said plurality of memory array blocks and being provided for supplying an equalization potential for equalizing said plurality of bit line pairs;
   a plurality of equalization potential sub-supply lines provided correspondingly to said plurality of memory array blocks, respectively, and each being provided for transmitting said equalization potential supplied from said equalization potential main supply line to each of said equalizer means equalizing said plurality of bit line pairs in the corresponding memory array block; and
   a plurality of cut-off means provided correspondingly to said plurality of equalization potential sub-supply lines, respectively, and being operable to cut off the supply of said equalization potential sent from said equalization potential main supply line to said equalization potential sub-supply line corresponding to defective one among said memory array blocks.

18. The semiconductor memory device according to claim 17, wherein
   a column address is input after input of a row address, and said plurality of sub-word lines are activated selectively in all of said plurality of memory array blocks in relation to input of the row address.

19. The semiconductor memory device according to claim 17, wherein a row address and a column address are input simultaneously, and said plurality of sub-word lines are activated selectively in the selected memory array block among said plurality of memory array blocks in relation to input of the row address and the column address.

20. The semiconductor memory device according to claim 17, further comprising:

a plurality of sense amplifier means provided correspondingly to said plurality of bit line pairs, respectively, each being operable to sense and amplify a potential difference on the corresponding bit line pair; and a plurality of switching means provided correspondingly to respective ones of said plurality of bit line pairs, between said memory cell array and said plurality of sense amplifier means, and each provided for switching the state of connection between said corresponding bit line pairs and said sense amplifier means, wherein said plurality of equalizer means are provided between said memory cell array and said plurality of switching means.

21. A semiconductor memory device comprising:

a memory cell array having a plurality of dynamic memory cells and divided into a plurality of memory array blocks;

a plurality of main word lines extending through said plurality of memory array blocks; and a plurality of bit line pairs arranged in each of said plurality of memory array blocks along a direction crossing said main word lines and connected to said plurality of memory cells in the corresponding memory array blocks, wherein each of said plurality of memory array blocks includes a plurality of sub-word lines connected to said plurality of memory cells in said memory array block and connected to said plurality of main word lines; and said semiconductor memory device further comprises:

a plurality of sense amplifier means provided correspondingly to said plurality of bit line pairs and each being operable to sense and amplify a potential difference on the corresponding bit line pair;

a sense amplifier activation signal main supply line arranged along said plurality of memory array blocks and being operable to supply a sense amplifier activation signal for activating said plurality of sense amplifier means;

a plurality of sense amplifier activation signal sub-supply lines provided correspondingly to said plurality of memory array blocks, respectively, and each being operable to transmit said sense amplifier activation signal supplied from said sense amplifier activation signal main supply line to said plurality of sense amplifier means corresponding to said plurality of bit line pairs in the corresponding memory array block; and a plurality of cut-off means provided correspondingly to said plurality of sense amplifier activation signal sub-supply lines, respectively, and each being operable to cut off the supply of said sense amplifier activation signal from said sense amplifier activation signal main supply line to said sense amplifier activation signal sub-supply line corresponding to defective one among said memory array blocks.

22. The semiconductor memory device according to claim 21, wherein a column address is input after input of a row address and said plurality of sub-word lines are activated selectively in all of said plurality of memory array blocks in relation to input of the row address.

23. The semiconductor memory device according to claim 21, wherein a row address and a column address are input simultaneously and said plurality of sub-word lines are activated selectively in the selected memory array block among said plurality of memory array blocks in relation to input of the row address and the column address.

24. A semiconductor memory device comprising:

a memory cell array having a plurality of memory cells and divided into a plurality of memory array blocks;

a plurality of normal main word lines extending through said plurality of memory array blocks;

a redundant main word line extending through said plurality of memory array blocks, wherein each of said memory array blocks includes:

a plurality of normal sub-word lines connected to said plurality of main word lines, respectively, a plurality of normal memory cells connected to said plurality of normal sub-word lines, respectively, a redundant sub-word line connected to said redundant main word line, the defective normal sub-word line being replaceable with said redundant sub-word line, and a redundant memory cell connected to said redundant sub-word line; and said semiconductor memory device further comprises:

a plurality of normal sub-word line activating means provided correspondingly to said plurality of memory array blocks, respectively, and each being operable to activate said plurality of normal sub-word lines in the corresponding memory array block; and a plurality of redundant sub-word line activating means provided correspondingly to said plurality of memory array blocks, respectively, and each being operable to activate said redundant sub-word line instead of defective one among said normal sub-word lines in the corresponding memory array block.

25. The semiconductor memory device according to claim 24, further comprising:

redundant main word line activating means for always activating said redundant main word line;

each of said plurality of redundant sub-word line activating means receiving an address for selecting said normal sub-word line and activating the corresponding redundant sub-word line in response to the received address.

26. The semiconductor memory device according to claim 24, wherein a column address is input after input of a row address containing an address for selecting said normal sub-word line to be activated, and said plurality of normal sub-word line activating means and said plurality of redundant sub-word line activating means select the corresponding normal sub-word lines and the corresponding redundant sub-word lines related to said row address, respectively.

27. The semiconductor memory device according to claim 24, wherein a row address and a column address are input simultaneously, and said plurality of normal sub-word line activating means and said plurality of redundant sub-word line activating means select said plurality of corresponding normal sub-word lines and said redundant sub-word lines related to said row or column address, respectively.

28. The semiconductor memory device according to claim 24, wherein
said memory cell array further includes a redundant memory array block;
said redundant memory array block includes:
a plurality of spare sub-word lines connected respectively to said plurality of normal main word lines, and
a plurality of spare memory cells connected respectively to said plurality of spare sub-word lines;
said semiconductor memory device further comprises spare sub-word line selecting means operable to activate said plurality of spare sub-word lines connected to said normal main word line connected to the defective normal sub-word line instead of said defective sub-word line in said memory array block; and
said normal sub-word line in each of said memory array blocks can be replaced with said redundant sub-word line in the corresponding memory array block or said spare sub-word line connected to the corresponding normal main word line.

29. The semiconductor memory device according to claim 24, wherein
each of said plurality of normal memory cells and said redundant memory cell includes a memory transistor and a memory capacitor;
each of said plurality of memory array blocks includes a cell plate divided correspondingly to said plurality of memory array blocks and forming a common electrode of said memory capacitors of said plurality of normal memory cells and said redundant memory cell, respectively, in one memory array block; and
said semiconductor memory device further comprises:
a cell plate potential supply line for supplying a cell plate potential to said respective cell plates of said plurality of memory array blocks; and
a plurality of cut-off means arranged between respective ones of said cell plates in said plurality of memory array blocks and said cell plate potential supply line, respectively, and being operable to cut off the supply of said cell plate potential to a defective one among said memory array blocks.

30. The semiconductor memory device according to claim 24, further comprising:
a bit line pair arranged in each of said plurality of memory array blocks along a direction crossing said plurality of normal main word lines and said redundant main word line and connected to said plurality of normal memory cells, and said redundant memory cell in the corresponding memory array blocks;
a plurality of equalizer means provided correspondingly to said plurality of bit line pairs corresponding to said plurality of memory array blocks, respectively, and each provided for equalizing potentials on the corresponding bit line pair;
an equalization control signal main supply line arranged along said plurality of memory array blocks and provided for supplying an equalization control signal for controlling said plurality of equalizer means;
a plurality of equalization control signal sub-supply lines provided correspondingly to said plurality of memory array blocks, respectively, and each provided for transmitting said equalization control signal supplied from said equalization control signal main supply line to said equalizer means equalizing said bit line pair in the corresponding memory array block; and
a plurality of cut-off means provided correspondingly to said plurality of equalization control signal sub-supply lines, respectively, for cutting off the supply of said equalization control signal from said equalization control signal main supply line to said equalization control signal sub-supply line corresponding to defective one among said memory array blocks.

31. The semiconductor memory device according to claim 24, further comprising:
a bit line pair arranged in each of said plurality of memory array blocks along the direction crossing said plurality of normal main word lines and said redundant main word line and connected to said plurality of normal memory cells and said redundant memory cell in the corresponding memory array blocks;
a plurality of equalizer means provided correspondingly to respective ones of said plurality of bit line pairs corresponding to said plurality of memory array blocks, respectively, and each provided for equalizing the potential of the corresponding bit line pair;
an equalization potential main supply line arranged along said plurality of memory array blocks for supplying an equalization potential equalizing said bit line pair in each memory array block, respectively;
a plurality of equalization potential sub-supply line provided corresponding to said plurality of memory array blocks, respectively, and each provided for transmitting said equalization potential supplied from said equalization potential main supply line to said equalizer means equalizing said bit line pair in the corresponding memory array block; and
a plurality of cut-off means provided correspondingly to said plurality of equalization potential sub-supply line, respectively, for cutting off the supply of said equalization potential from said equalization potential main supply line to said equalization potential sub-supply line corresponding to defective one among said memory array blocks.

32. The semiconductor memory device according to claim 24, further comprising:
a bit line pair arranged in each of said plurality of memory array blocks along a direction crossing said plurality of normal main word lines and said redundant main word line and connected to said plurality of normal memory cells and said redundant memory cell in the corresponding memory array block;
a plurality of sense amplifier means provided correspondingly to respective ones of said plurality of bit line pairs corresponding to said plurality of memory array blocks, respectively, and each being operable to sense and amplify a potential difference on the corresponding bit line pair;
a plurality of switching means arranged between said corresponding bit line pairs and said sense amplifier means, respectively, for switching the state of connection between them;
a switching control signal main supply line arranged along said plurality of memory array blocks for supplying a switching control signal for controlling said plurality of switching means;

a plurality of switching control signal sub-supply lines provided correspondingly to said plurality of memory array blocks, respectively, and each being operable to transmit said switching control signal supplied from said switching control signal main supply line to the switching means corresponding to said bit line pair in the corresponding memory array block; and a plurality of cut off means provided correspondingly to said plurality of switching control signal sub-supply lines, respectively, and each being operable to cut off the supply of said switching control signal from said switching control signal main supply line to said switching control signal sub-supply line corresponding to defective one among said memory array blocks.

33. The semiconductor memory device according to claim 24, further comprising:

a bit line pair arranged in each of said plurality of memory array blocks along a direction crossing said plurality of normal main word lines and said redundant main word line and connected to said plurality of normal memory cells and said redundant memory cell in the corresponding memory array block;

a plurality of sense amplifier means provided correspondingly to respective ones of said plurality of bit line pairs corresponding to said plurality of memory array blocks, respectively, and each being operable to sense and amplify a potential difference on the corresponding bit line pair;

a sense amplifier activation signal main supply line arranged along said plurality of memory array blocks and being operable to supply a sense amplifier activation signal for activating said plurality of sense amplifier means;

a plurality of sense amplifier activation signal sub-supply lines provided correspondingly to said plurality of memory array blocks, respectively, and each being operable to transmit said sense amplifier activation signal supplied from said sense amplifier activation signal main supply line to said sense amplifier means corresponding to said bit line pair in the corresponding memory array block; and a plurality of cut-off means provided correspondingly to said plurality of sense amplifier activation signal sub-supply lines, respectively, and each being operable to cut off the supply of said sense amplifier activation signal from said sense amplifier activation signal main supply line to said sense amplifier activation signal sub-supply line corresponding to defective one among said memory array blocks.

34. A semiconductor memory device comprising:

a memory cell array having a plurality of memory cells and divided into a plurality of normal memory array blocks and a redundant memory array block;

a plurality of normal main word lines extending through said plurality of normal memory array blocks and said redundant memory array block, wherein each of said normal memory array blocks includes:

a plurality of normal sub-word lines connected to said plurality of normal main word lines, respectively, a plurality of normal memory cells connected to said plurality of normal sub-word lines, respectively, and a normal bit line pair crossing said plurality of normal main word lines and receiving data selectively from said plurality of normal memory cells;

said redundant memory array block includes:

a plurality of redundant sub-word lines connected to said plurality of normal main word lines, respectively, a plurality of redundant memory cells connected to said plurality of redundant sub-word lines, and a redundant bit line pair crossing said plurality of normal main word lines and receiving data selectively from said plurality of redundant memory cells;

each of said redundant sub-word lines can be replaced with defective one among said normal sub-word lines connected to the corresponding normal main word line; and said semiconductor memory device further comprises:

a plurality of sense amplifier means provided correspondingly to said normal bit line pairs in said plurality of memory array blocks and said redundant bit line pair, respectively, and each being operable to sense and amplify a potential difference on the corresponding bit line pair;

an input/output line pair transmitting the outputs sent from said plurality of sense amplifier means;

a plurality of switching means arranged between said plurality of sense amplifier means and said input/output line pair, respectively, and being selectively turned on/off for selectively transmitting the outputs of said plurality of sense amplifier means to said input/output line pair; and an address comparison control means being operable to store precedingly an address corresponding to the normal sub-word line replaced with said redundant sub-word line, and compare said address with an address input for selecting said normal sub-word line, said address comparison control means controlling said plurality of switching means to transmit the output of said sense amplifier means corresponding to said redundant bit line pair to said input/output line pair when these addresses match each other, said address comparison control means controlling said plurality of switching means to transmit the output of said sense amplifier means corresponding to said normal bit line pair to said input/output line pair when these addresses do not match each other, and the amplifying operation by said plurality of sense amplifier means being performed in parallel with the address comparing operation by said address comparison control means.

35. A semiconductor memory device comprising:

a memory cell array having a plurality of memory cells and divided into a plurality of normal memory array blocks and a redundant memory array block; and a plurality of normal main word lines extending through said plurality of normal memory array blocks and said redundant memory array block, wherein each of said normal memory array blocks includes:

a plurality of normal sub-word lines connected to said plurality of normal main word lines, respectively, a plurality of normal memory cells connected to said plurality of normal sub-word lines, respectively, and a normal bit line pair crossing said plurality of normal main word lines and receiving data selectively from said plurality of normal memory cells;

said redundant memory array block includes:

a plurality of redundant sub-word lines connected to said plurality of normal main word lines, respectively, a plurality of redundant memory cells connected to said plurality of redundant sub-word lines, and a redundant bit line pair crossing said plurality of normal main word lines and receiving data selectively from said plurality of redundant memory cells;

each of said redundant sub-word lines can be replaced with defective one among said normal sub-word lines connected to the corresponding normal main word line;

said semiconductor memory device further comprises:

a plurality of sense amplifier means provided correspondingly to said normal bit line pairs in said plurality of memory array blocks and said redundant bit line pair, respectively, and each being operable to sense and amplify a potential difference on the corresponding bit line pair;

a plurality of input/output line pairs provided correspondingly to said plurality of sense amplifier means and each transmitting the output of the corresponding sense amplifier means;

address comparing means for storing precedingly an address corresponding to said normal sub-word line replaced with said redundant sub-word line and comparing said address with an address input for selecting the normal sub-word line for outputting a result of the comparison; and multiplexer means for receiving information indicative of the result of comparison by said address comparing means, and being operable to output the potential difference on said input/output line pair transmitting the output of said sense amplifier means corresponding to said redundant bit line pair when the compared addresses match each other, and output the potential difference on said input/output line pair transmitting the output of said sense amplifier means corresponding to said normal bit line pair when the compared addresses do not match each other, the amplifying operation by said plurality of sense amplifier means being executed in parallel with the address comparing operation by said address comparing means.

36. A semiconductor memory device comprising:

a memory cell array having a plurality of dynamic memory cells; and a plurality of main word lines extending through said memory cell array, wherein said memory cell array is divided into:

a plurality of normal memory array blocks and, a redundant memory array block for replacing a defective one among said normal memory array blocks;

each of said normal and redundant memory array blocks has a plurality of sub-word lines connected to said plurality of memory cells in said memory array block and connected to said plurality of main word lines, respectively; and said sub-word lines connected to said main word lines to be activated are activated in all of said plurality of normal memory array blocks and said redundant memory array block in a refresh operation.

37. A semiconductor memory device wherein row and column addresses are successively input, and a memory cell is selected in accordance with said input row and column addresses, comprising:

a memory cell array having a plurality of dynamic memory cells; and a plurality of main word lines extending through said memory cell array and selected in accordance with said row address, wherein said memory cell array is divided into:

a plurality of normal memory array blocks, and a redundant memory array block for replacing a defective one among said normal memory array blocks;

each of said normal and redundant memory array blocks has a plurality of sub-word lines connected to said plurality of memory cells in said memory array block and connected to said plurality of main word lines, respectively; and said sub-word lines connected to said main word lines to be activated are activated in all of said plurality of normal memory array blocks and said redundant memory array block in a normal operation and a refresh operation.

38. A semiconductor memory device wherein a memory cell is selected in accordance with simultaneously input row and column addresses, comprising:

a memory cell array having a plurality of dynamic memory cells; and a plurality of main word lines extending through said memory cell array and are selected in accordance with said row address, wherein said memory cell array is divided into:

a plurality of normal memory array blocks, and a redundant memory array block for replacing a defective one among said normal memory array blocks;

each of said plurality of normal memory array blocks and said redundant memory array block has a plurality of sub-word lines connected to said plurality of memory cells in said memory array block and connected to said plurality of main word lines, respectively; and said sub-word lines connected to said main word lines to be activated are activated in all of said plurality of normal memory array blocks and said redundant memory array block in a refresh operation.

39. A semiconductor memory device, comprising:

a memory cell array having a plurality of dynamic memory cells and divided into a plurality of memory array blocks; and a plurality of main word lines extending through said plurality of memory array blocks, wherein each of said plurality of memory array blocks includes a plurality of sub-word lines connected to said plurality of memory cells in the memory array block and connected to said plurality of main word lines, respectively; and said semiconductor memory device further comprises:

a main supply line arranged along said plurality of memory array blocks for supplying a potential employed for the operation of said plurality of memory array blocks;

a plurality of sub-supply lines provided correspondingly to said plurality of memory array blocks, respectively, and each provided for further transmission of said potential supplied from said main supply line for the operation of the corresponding memory array block; and a plurality of cut-off means provided correspondingly to said plurality of sub-supply line, respectively, and being operable to cut off the supply of said potential from said main supply line to said sub-supply line corresponding to defective one among said memory array blocks.

40. The semiconductor memory device according to claim 39, wherein said potential supplied from said main supply line and said sub-supply line is a signal potential.

41. The semiconductor memory device according to claim 39, wherein said potential supplied from said main supply line and said sub-supply line is a potential for defining the potential in said memory array block.

* * * * *